United States Patent [19]
Takubo et al.

[11] Patent Number: 5,204,711
[45] Date of Patent: Apr. 20, 1993

[54] PROJECTION EXPOSURE DEVICE

[75] Inventors: Minoru Takubo, Tokyo; Toshio Fukasawa, Ebina; Masahiro Miyashita, Yokohama; Yousuke Takagi, Fujisawa, all of Japan

[73] Assignee: Nippon Seiko Kabushiki Kaisha, Tokyo, Japan

[21] Appl. No.: 712,100

[22] Filed: Jun. 7, 1991

[30] Foreign Application Priority Data

| Jun. 8, 1990 | [JP] | Japan | 2-150901 |
| Oct. 22, 1990 | [JP] | Japan | 2-283620 |
| May 29, 1991 | [JP] | Japan | 3-126006 |

[51] Int. Cl.$^5$ ............................................. G03B 27/42
[52] U.S. Cl. ........................................ 355/53; 355/71; 355/93
[58] Field of Search ........................ 355/18, 93, 53, 71

[56] References Cited

U.S. PATENT DOCUMENTS

| 3,383,982 | 5/1968 | Moss | 355/53 |
| 3,494,695 | 2/1970 | Sollima et al. | 355/53 |
| 3,497,705 | 2/1970 | Adler | 355/53 |
| 4,189,230 | 2/1980 | Zasio | 355/53 |
| 4,362,385 | 12/1982 | Lobach | 355/53 |
| 4,448,518 | 5/1984 | Nishida et al. | 355/18 |
| 4,662,754 | 5/1987 | Mayer | 355/53 |
| 4,924,257 | 5/1990 | Jain | 355/53 |

FOREIGN PATENT DOCUMENTS

| 62-152293 | 9/1987 | Japan . |
| 62-158824 | 10/1987 | Japan . |
| 63-155637 | 10/1988 | Japan . |
| 64-37044 | 3/1989 | Japan . |
| 64-54335 | 4/1989 | Japan . |
| 1-97288 | 6/1989 | Japan . |

Primary Examiner—Monroe H. Hayes
Attorney, Agent, or Firm—Basile and Hanlon

[57] ABSTRACT

In a projection exposure device in which an exposure light from a light source device is transmitted through a mask having a predetermined pattern formed therein and then an image of a mask pattern is focused by a projection lens on an exposure member held by a holding mechanism, an exposure light is emitted from the light source device along a horizontal optical axis. The mask, the projection lens and the exposure member are disposed on the horizontal optical axis and the holding mechanism is formed such that the exposure member is movable at least within a plane perpendicular to the horizontal optical axis. The distortion of the exposure member can be prevented to enable exposure at high accuracy and, also, with high throughput by holding the exposure member vertically, mask alignment is facilitated, the effect of heat from the light source can be minimized, and the size and the cost of the device can be reduced.

43 Claims, 19 Drawing Sheets

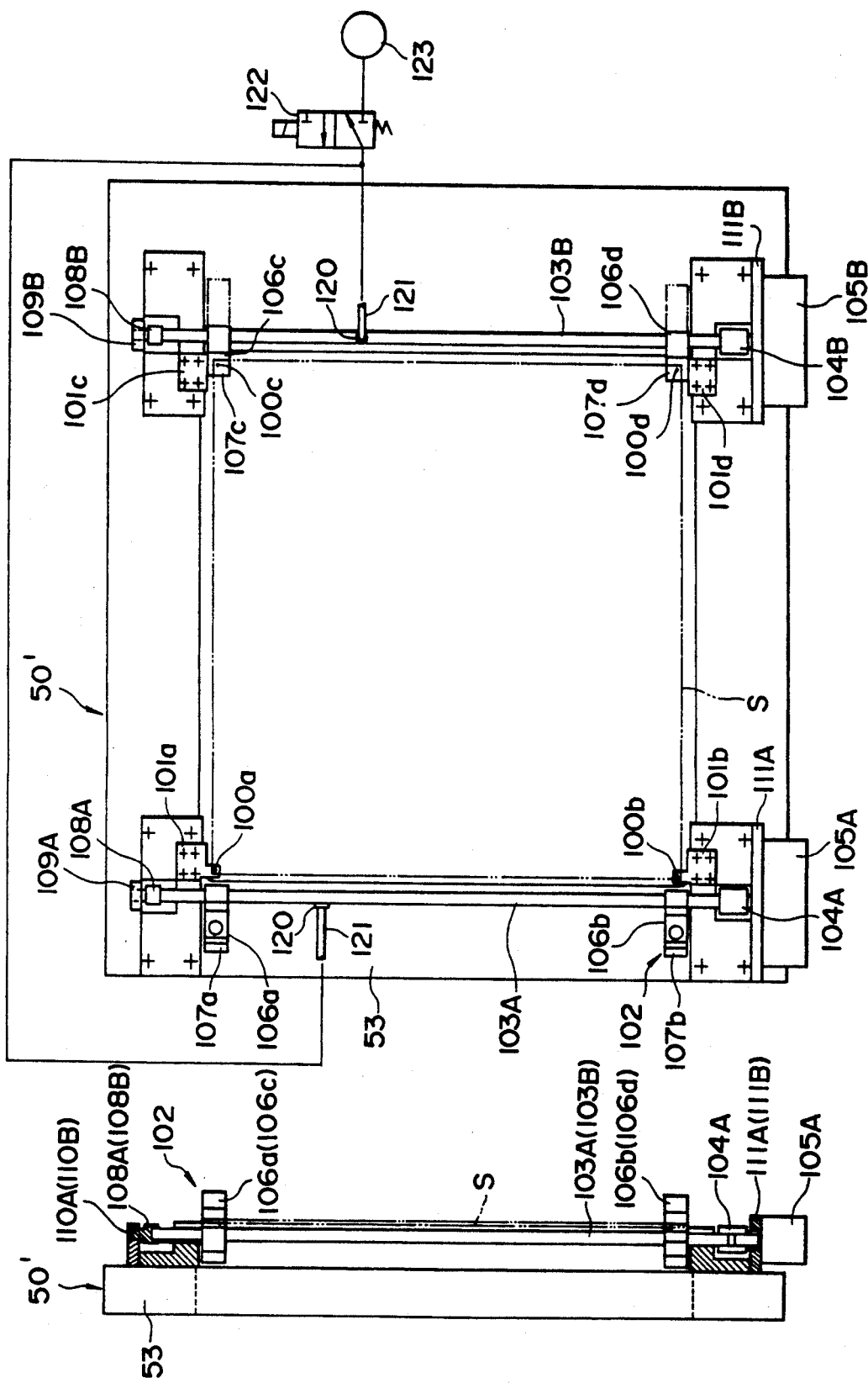

PROJECTION EXPOSURE DEVICE

BACKGROUND OF THE INVENTION

1. Field of the Invention

The present invention concerns a projection exposure device for exposing a fine pattern over a large area on a member to be exposed and, in particular, to a lateral type projection exposure device.

2. Description of the Prior Art

The projection exposure device of the aforementioned type has been described, for example, in Japanese Utility Model Laid-Open Sho 62-152293, 62-158824, 63-155637, 64-37044, 64-54335 and Hei 1-97288, each of which was previously proposed by the assignee of the present invention.

Each of the prior art devices has a vertical type structure in which a member to be exposed (hereinafter referred to as an exposure member) is disposed in a horizontal direction and a projection lens, a mask and a light source are sequentially disposed on a vertical optical axis relative to the exposure member and can conduct an accurate exposure to the exposure member having a relatively large area, such as a shadow mask of a display or a liquid crystal device.

However, in the projection exposure device of the known type described above, since the exposure member is placed in the horizontal direction with the optical axis being in the vertical direction, there has been a problem that distortion tends to be caused in the exposure member as the exposing area of the exposure member is enlarged thereby making it difficult to form an exposure pattern at a high accuracy.

For overcoming such a problem there has been proposed an exposure device as described in Japanese Patent Laid-Open Hei 1-312547 in which a continuous metal strip having a photosensitive layer coated on each of the surfaces (exposure member) is transported in a vertically standing direction and a shadow mask pattern is exposed in an intimate contact by a exposure device main body opposing a pair of vertically disposed negative dry plates to the continuous metal strip.

However, in the exposure device for the contact exposure proposed above, although the distortion of the exposure member by its own weight can be prevented by transporting the exposure member while standing it vertically, it is necessary to form both of the negative dry plates and the exposure member in substantially the same size due to the employment of the both face contact exposure system. Accordingly, problems arise in that high accuracy exposure of a plurality of patterns of the exposure member having a large area by a step-and-repeat system is impossible, there is an inevitable limit for forming a plurality of patterns at a high accuracy on a negative dry plate of a large area, and exposure of an exact pattern is difficult since heat expansion of the negative dry plate is caused by the heat generated from the light source.

SUMMARY OF THE INVENTION

In view of the above, the present invention has been accomplished taking notice of the problems in the prior art and it is an object of the present invention to provide a projection exposure device with a lateral optical axis capable of exposing a plurality of relatively large patterns at a high accuracy by the step-and-repeat system on an exposure member having a large area.

The foregoing object of the present invention can be attained by a projection exposure device in which an exposure light from a light source device transmits through a mask having a predetermined pattern formed therein and then an image of a mask pattern is focused by a projection lens on an exposure member held by a holding mechanism, wherein an exposure light is emitted from the light source device along a horizontal optical axis, the mask, the projection lens and the exposure member are disposed on the horizontal optical axis, and the holding mechanism is constructed such that the exposure member is made movable at least within a plane perpendicular to the horizontal optical axis.

In one embodiment of the present invention, the distance between the projection lens and the mask is made equal with that between the projection lens and the exposure member and the mask and the exposure member are made movable independent of each other within a plane perpendicular to the horizontal optical axis.

In another embodiment of the present invention, the light source device comprises, on a truck independently movable along the horizontal optical axis, a light emitting source for emitting an exposure light with a wavelength shorter than that of infrared light, an integrator for making the light emitted from the light emitting source uniform, an optical axis changing means of changing the optical path of the light emitted from the integrator, and a concave mirror for collecting the light obtained from the optical axis changing means and reflecting the same in the direction of the horizontal optical axis. The concave mirror may be replaced with a Fresnel lens.

In the projection exposure device according to the present invention, the exposure light from the light source is irradiated through the mask and the projection lens disposed on the horizontal optical axis to the exposure member to expose a mask pattern to the exposure member. In this case, since the exposure member is held in the vertical direction by the holding mechanism, distortion of the exposure member by its own weight can be prevented such that the exposure surface can be flattened and the mask pattern can be exposed at a high accuracy. Further, since the exposure member is made movable by the holding mechanism, at least within the plane perpendicular to the horizontal optical axis, a plurality of mask patterns can be exposed by the step-and-repeat system on the exposure member to improve the throughput of the exposure device.

Further, when the distance between the projection lens and the mask is made equal with that between the projection lens and the exposure member, and the mask and the exposure member are made movable independently of each other within the plane perpendicular to the horizontal optical axis, the alignment between the exposure member and the mask, as well as the magnification ratio between the mask pattern and the pattern projected on the exposure member can be easily adjusted.

Further, when the light source device is made independent from the mask, the projection lens and the exposure member, heat generated in the light source causes no undesired effects on the chamber containing the mask, the projection lens and the exposure member such that the capacity of the chamber can be reduced to save operating costs and the initial cost of the device. Further, by changing the optical axis of the exposure light from the light emitting source, for example, by an optical axis changing means comprising the total reflection mirror and the concave mirror, the horizontal distance of the light source device can be shortened to reduce the size of the device.

BRIEF DESCRIPTION OF THE DRAWINGS

These and other objects, features, and advantageous effects of the present invention will now be described by way of preferred embodiments with reference to the accompanying drawings in which:

FIG. 15 is a front elevational view illustrating another embodiment of an exposure member holding mechanism;

FIG. 16 is a side elevational view of the exposure member holding mechanism shown in FIG. 15;

DETAILED DESCRIPTION FOR THE PREFERRED EMBODIMENTS

Figure 1:
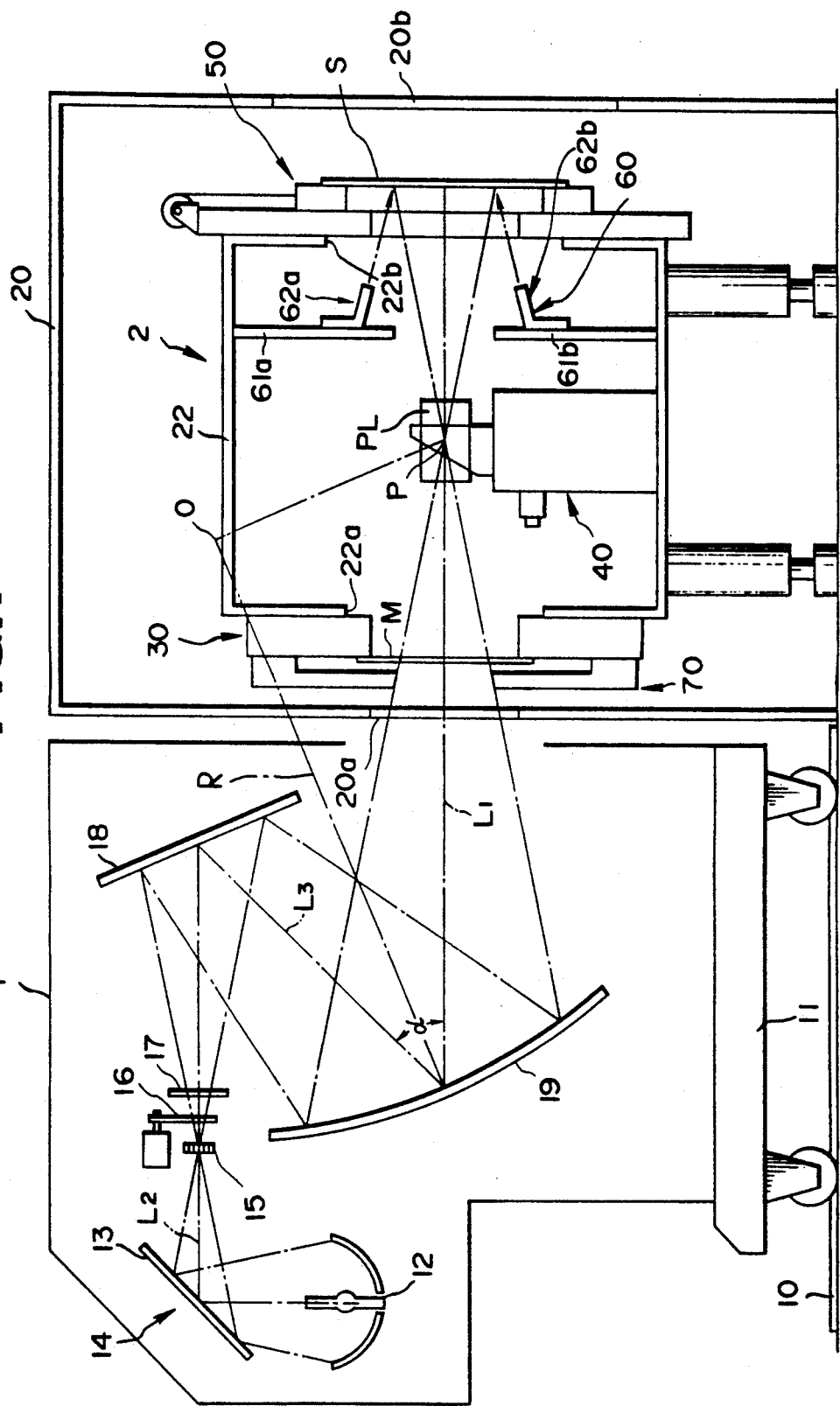
FIG. 1 is a front elevational view illustrating the construction of a preferred embodiment of the present invention.
Figure 2:
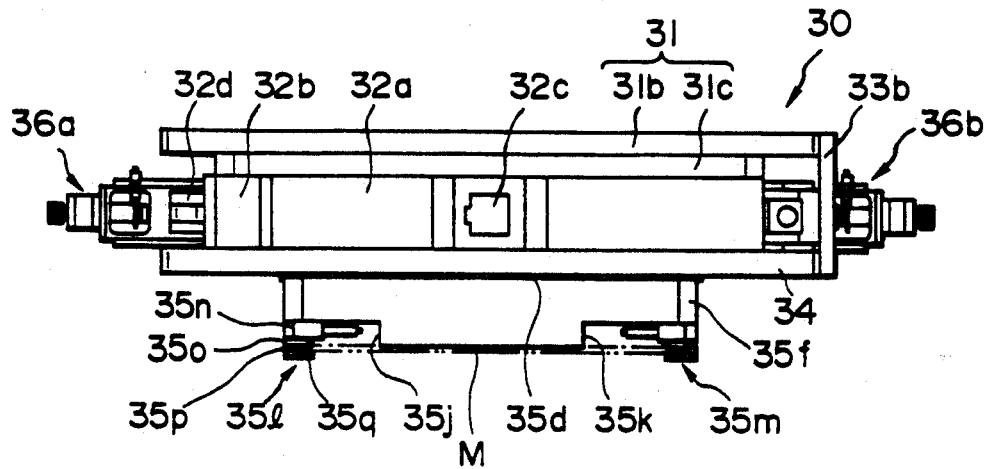
FIG. 2 is a plan view illustrating a mask holding mechanism shown generally in FIG. 1.

FIG. 1 is a schematic view illustrating the entire construction of the present invention.

In FIG. 1, exposure light emitted from a light source device 1 with a horizontal optical axis $L_1$ enters an exposure device main body 2.

The light source device 1 has a truck 11 guided on guide rails 10 in the direction of the horizontal optical axis $L_1$. On the truck 11, there are disposed a light emitting source 14 comprising a light source 12, such as a mercury lamp or a xenon lamp, for emitting optical rays upwardly and a dichroic mirror 13 having a horizontal optical axis for transmitting a wavelength component in an infrared region among the exposure light from the light source 12 and reflecting other wavelength components as an exposure light. The exposure light emitted from the light emitting source 14 is made uniform through an integrator 15 and passes through a shutter 16 which restricts the amount of exposure and a filter 17 which allows only the light at an exposure wavelength (for example, g-rays) to pass therethrough before it is reflected downwardly by a total reflection mirror 18 which acts as an optical axis changing means. The reflection light is reflected on a concave mirror 19 with a large curvature and then gathered on the horizontal optical axis $L_1$. In this case, the concave mirror 19 is provided with a concave surface with a radius of R having a center at a point O that is situated on a bisector of an angle $\alpha$ formed between the horizontal optical axis $L_1$ and the optical axis $L_3$ of the reflection light reflected from the total reflection mirror 18. Accordingly, assuming that the length of the optical axis from the integrator 15 to the concave mirror 19 is L, the exposure light reflected at the concave mirror 18 is collected at a position P on the horizontal optical axis $L_1$ at a length equal with the optical axis length L from the concave mirror 19 and an optical image at the exit of the integrator 15 is focused in an elliptic form.

The exposure device main body 2 includes a mask holding mechanism 30 disposed at a window 22a on the left end of a casing 22 disposed in a chamber 20. The casing 22 is secured to an installation surface and has windows 22a and 22b at positions corresponding to the horizontal optical axis $L_1$. The mask holding mechanism 30 holds a mask M formed with an exposure pattern movably within a plane perpendicular to the horizontal optical axis $L_1$. A lens holding mechanism 40 is disposed within the casing 22 for movably holding a projection lens PL in the direction of the horizontal optical axis $L_1$. An exposure member holding mechanism 50 is disposed at the position of the window 22b on the right end of the casing 22 and holds an exposure member S in which alignment marks $AM_{S1}$ and $AM_{S2}$, described hereafter, are formed above and below an exposure region coated with a photoresist. An illumination mechanism 60 is disposed in the casing 22 for illuminating the alignment marks $AM_{S1}$ and $AM_{S2}$ of the exposure member S. Finally an alignment mark detection mechanism 70 disposed on the mask holding mechanism 30 for superposing the alignment marks $AM_{S1}$ and $AM_{S2}$ illuminated by the illumination mechanism 60 with alignment marks $AM_{M1}$ and $AM_{M2}$ on the mask M and for detecting the positional alignment between both sets of marks.

The chamber 20 is controlled to a standard temperature and is filled with clean air from which dust has been removed by a filter so as to constitute a clean room. The chamber 20 has a window 10a formed on the side wall thereof to which the exposure light from the light emitting device 1 enters. An opening/closing door 20b is formed on the side wall opposite to the window 20a.

As shown in FIG. 2 through FIG. 5, the mask holding mechanism 30 includes a mounting base plate 31 attached to the window 11a of the casing 22 and having a perforation 31a formed in the central portion thereof. An upper face plate 34 is attached to the mounting base plate 31 by way of spacers 32a, 32b and connection plates 33a, 33b and also having a perforation 34a formed on the central portion thereof. A mask stage 35 is movably held between the mounting base plate 31 and the upper face plate 34 within a plane perpendicular to the horizontal optical axis $L_1$ and has a perforation 35a formed in the central portion thereof and a stage moving mechanism 36 for moving the mask stage 35 in the vertical or horizontal direction and for slightly rotating it around the horizontal optical axis $L_1$ as the center.

Figure 3:
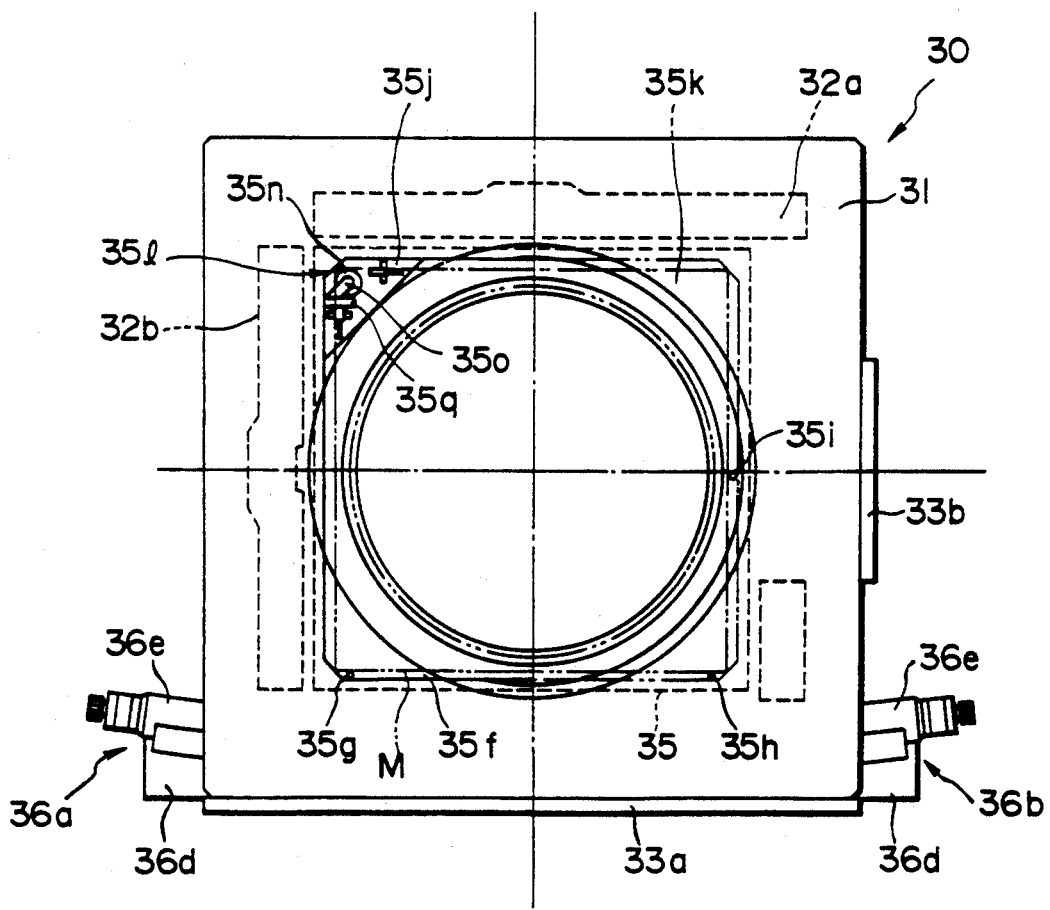
FIG. 3 is a front elevational view of the mask holding mechanism with a mask chuck being removed from the right half portion.
Figure 4:
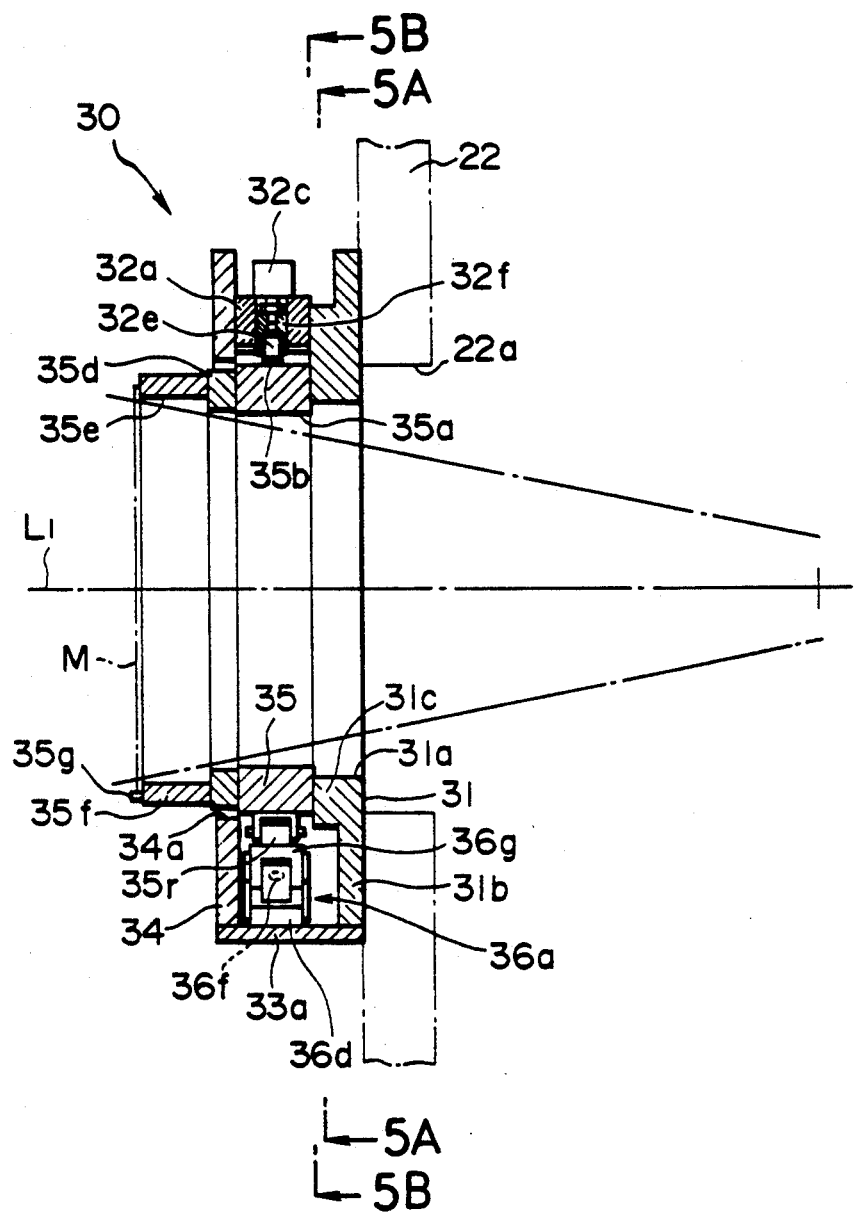
FIG. 4 is a vertical cross sectional view through a central portion of the mask holding mechanism shown in FIG. 3.
Figure 5:
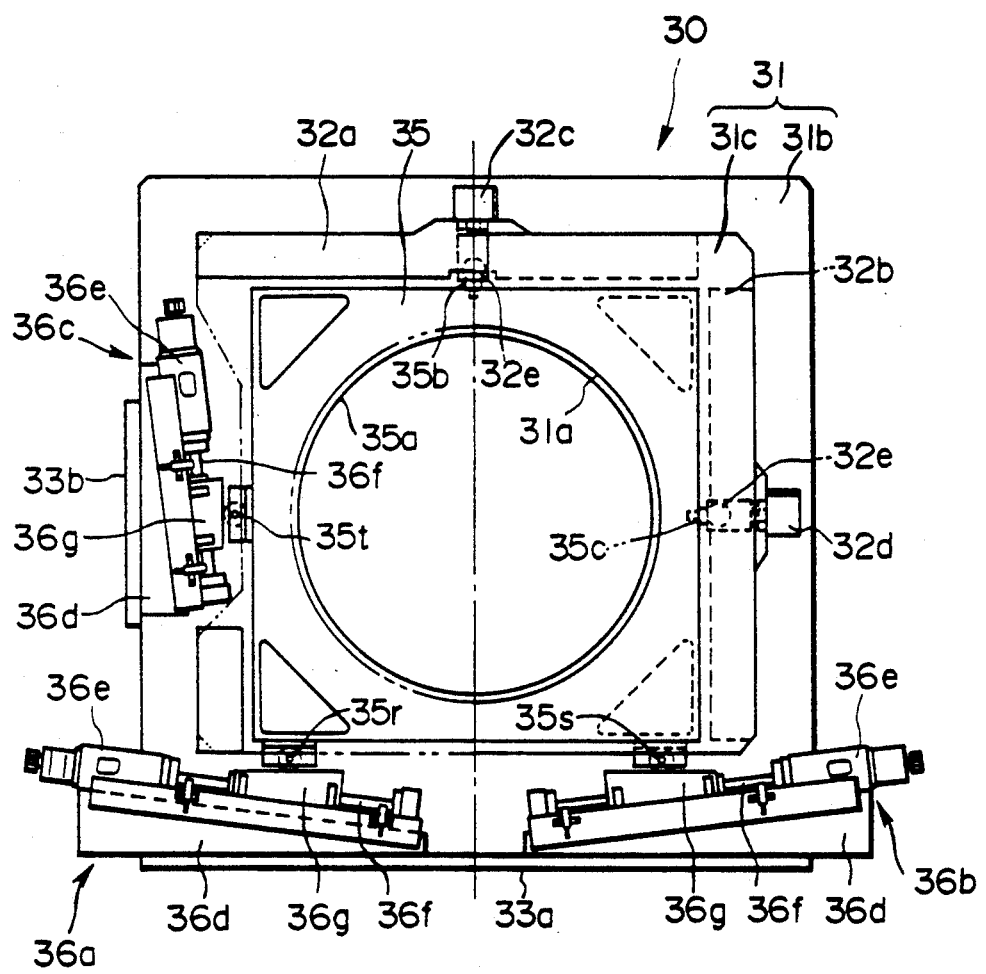
FIG. 5 is a cross sectional view, in which the left-half portion is illustrated as generally taken along line 5B—5B in FIG. 4, while the right-half portion is illustrated as generally taken along line 5A—5A in FIG. 4.

As is apparent in FIG. 3 through FIG. 5, the mounting base plate 31 has a convex shape formed a square base portion 31b and a smaller square stage holding portion 31c formed thereon and disposed in contact with the mask stage 35.

Further, the spacers 32a and 32b are disposed on the stage holding portion 31c on the upper side and the left sides of the perforation 31a, respectively. Air cylinders 32c and 32d are attached to the central portions thereof, respectively, for providing a preliminary pressure to the mask stage 35. As shown in FIG. 4, the top end of a piston rod of each of the air cylinders 32c and 32d is connected to a slider 32f for rotatably holding a roller 32e in rolling contact with each of abutting plates 35b and 35c attached to the mask stage 35.

Further, the mask stage 35 is attached on the left end surface, by way of an annular spacer 35b, with a square mask chuck 35f having a perforation 35e formed in its central portion and a vacuum attraction portion (not illustrated) disposed on its left end surface. Positioning pins 35g, 35h and 35i protrude from the lower end and the right end of the left end surface of the mask chuck 35f for positioning the mask M and trigonal notches 35j and 35k are formed at both corners on the side of the upper end. Retainer members 35l and 35m are opposed to the notches 35j and 35k, respectively, for retaining the upper end of the mask M. Each of the retainer members 35l and 35m comprises a rotary actuator 35n mounted to each of the notches 35j and 35k, a rotary arm 35o secured to the upper end of the rotary actuator 35n, and a retainer 35q attached to the free end of the rotary arm 35o with a spacer 35p corresponding to the thickness of the mask M.

Further, as can be see in FIG. 5, the stage moving mechanism 36 includes vertically driving assemblies 36a and 36b attached to the connection plate 33a opposing guide rollers 35r and 35s attached to both of the forward and rearward ends of the lower end edge of the mask stage 35, and a horizontally driving assembly 36c attached to the connection plate 33b opposing a guide roller 35t attached to the central portion on the left end edge of the mask state 35. Each of the driving assemblies 36a-36c comprises a driving motor 36e, a screw shaft 36f connected to the rotary shaft of the motor and a wedge-shaped slider 36g incorporating a ball nut and screw-coupling with the screw shaft 36f and having a sliding contact surface in parallel with the end edge of the mask stage 35. Each of the guide rollers 35r and 35t on the mask stage 35 is put into rolling contact with the sliding contact surface of the slider 36g. Accordingly, when the driving motors 36e for the horizontally driving assemblies 36a and 36b are rotated, for instance, backwardly to slide both of the sliders 36g toward the central portions, the sliding contact surface of each of the sliders 36g moves downward in parallel to lower the mask stage 35. On the other hand, when each of the sliders 36g is caused to slide outwardly by the forward rotation of the driving motor 36e, the sliding contact surface of the slider 36g moves upwardly in parallel to elevate the mask stage 35 against the urging force of the air cylinder 32c. Further, when the driving motor 36e of the horizontally driving assembly 36c is rotated, for instance, backwardly thereby causing the slider 36g to slide downwardly, the sliding surface of the slider 36g moves rightward against the urging force of the air cylinder 32d in FIG. 5. On the other hand, when the driving motor 36e is rotated forwardly to slide the slider 36g upwardly, the sliding contact surface of the slider 36g moves leftward in parallel to displace the mask stage 35 leftward. Furthermore, when the slider 36g of one vertically driving assembly 36a is caused to slide leftward and the slider 36g of the other vertically driving assembly 36b is caused to slide leftward and the slider 36g of the horizontally driving assembly 36 is caused to slide downwardly, the mask stage 35b can be rotated slightly clockwise by about 1° as shown in FIG. 5 around the horizontal optical axis $L_1$ as the center. On the other hand, when each of the driving assemblies 36a-36c is caused to slide in the opposite direction, the mask stage 35 can be rotated slightly by about 1° in the counterclockwise direction.

Figure 6:
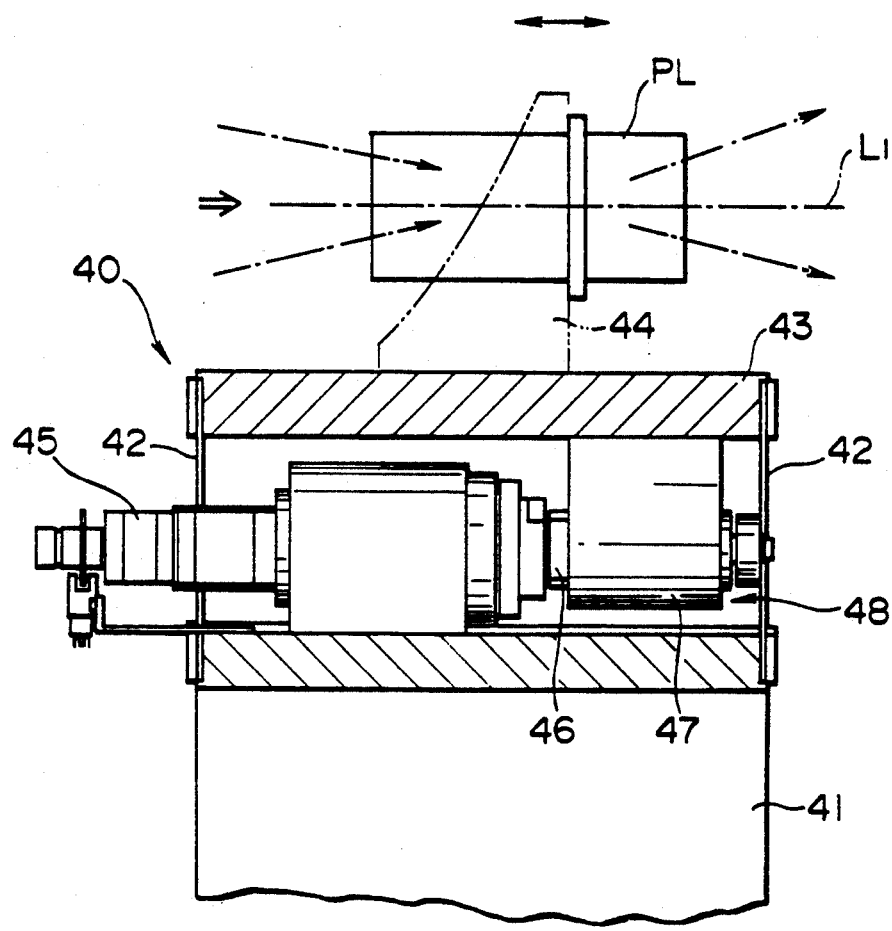
FIG. 6 is a cross sectional view illustrating a lens holding mechanism shown schematically in FIG. 1.

As shown in FIG. 6, in the lens holding mechanism 40, a movable plate 4 is supported by four leaf springs 42 which are disposed above the upper end surface of a substrate block 41 located at the bottom of the casing 22. A projection lens PL is supported on a bracket 44 attached on the movable plate 43, with its optical axis being aligned with the horizontal optical axis $L_1$. The movable plate 43 is moved slightly by about ±1 mm in the direction of the horizontal optical axis $L_1$ by a linear moving mechanism 48 which includes a driving motor 45 secured to the upper end surface of the substrate block 41, a screw shaft 46 connected to a rotary shaft of the motor 45 and a ball nut 47 disposed in screw-coupling with the screw shaft 46 and secured to the lower surface of the movable plate 43.

Figure 7:
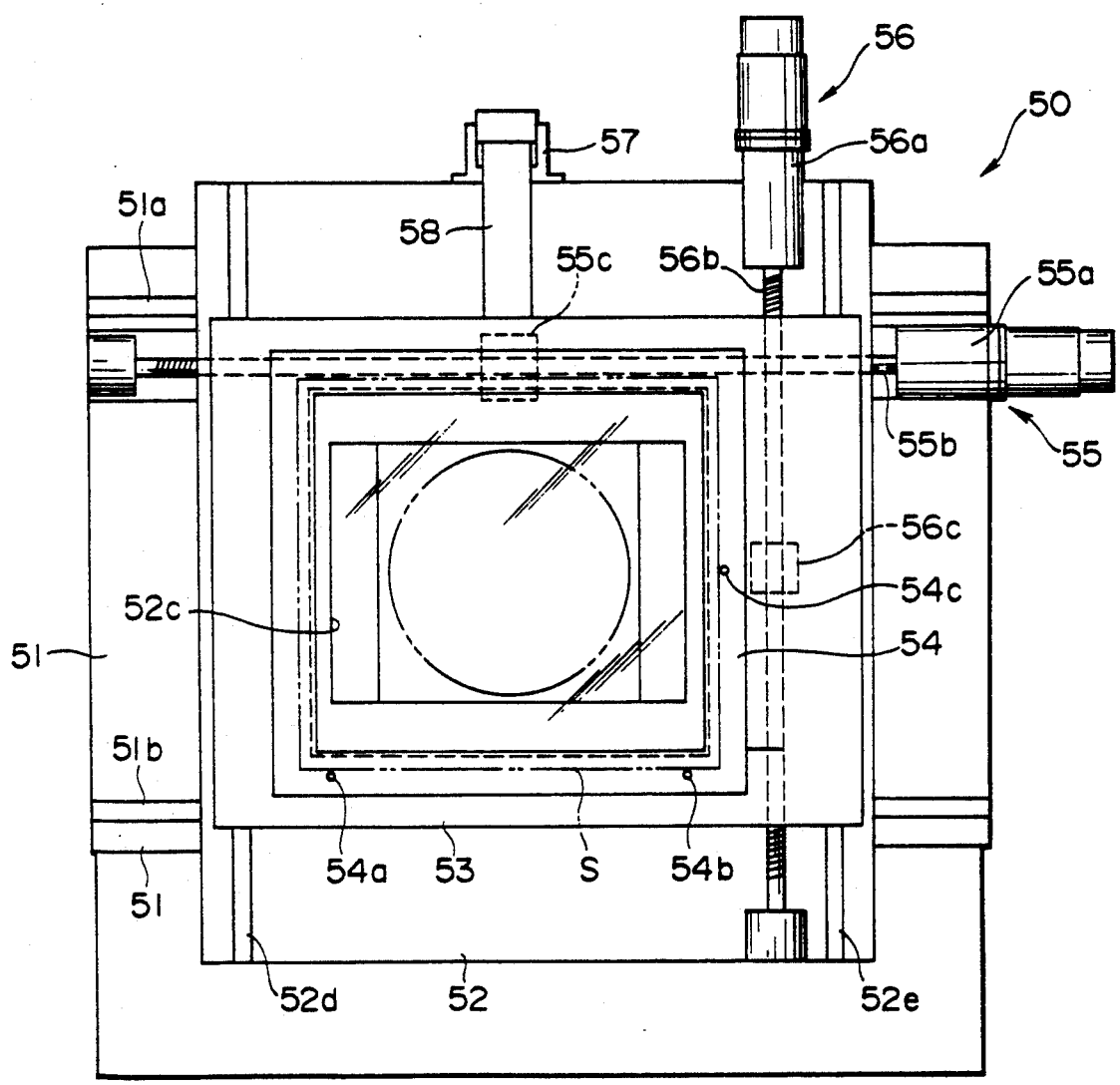
FIG. 7 is a front elevational view illustrating an exposure member holding mechanism shown generally in FIG. 1.
Figure 8:
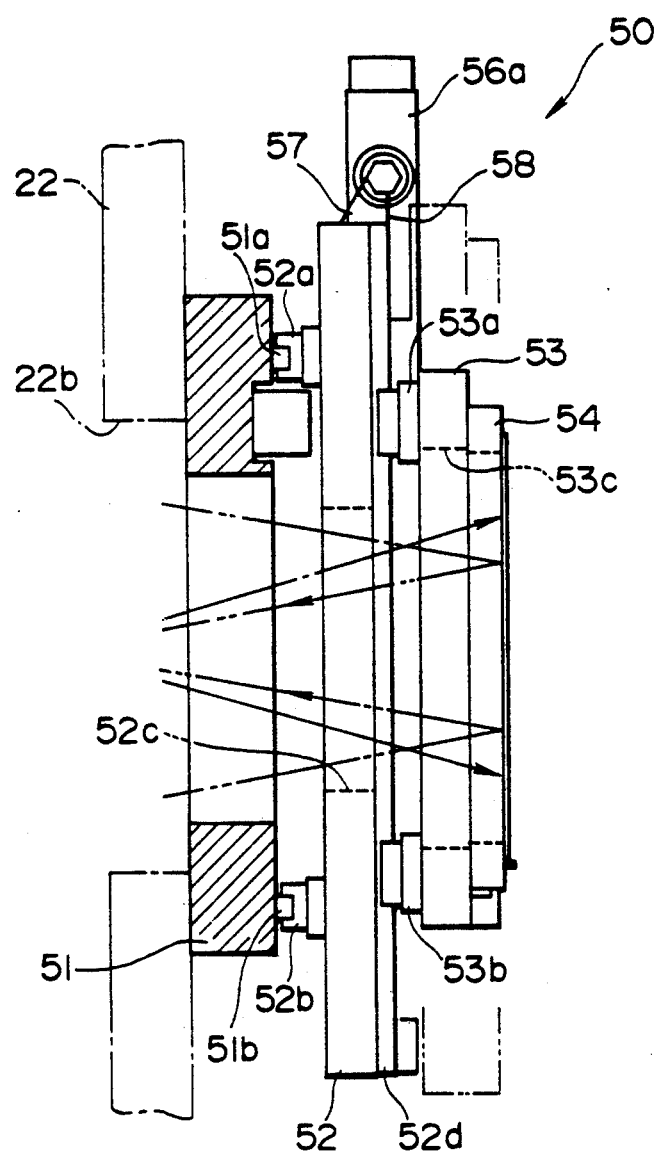
FIG. 8 is a vertical cross sectional view through a central portion of the exposure member holding mechanism shown in FIG. 7.

As shown in FIGS. 7 and 8, the exposure member holding mechanism 50 includes a rectangular frame 51 attached to the periphery of the window 22b in the casing 22 and having horizontally extended guide rails 51a and 51b attached, respectively, to the upper end and to the lower end on the right end surface thereof. A horizontally moving table 52 is disposed horizontally and slidably by way of sliders 52a and 52b which engage the guide rails 51a and 51b on the side of the right end surface of the rectangular frame 51. The moving table 52 has a perforation 52 formed in its central portion. Guide rails 52d and 52e are disposed on the side of the right end surface and extend vertically. A vertically moving table 53 is disposed vertically and slidably by way of sliders 53a and 53b engaging of the horizontally moving table 52 and has a perforation 53c formed in its central portion. A holding chuck 54 is secured to the right end face of the vertically moving table 53 for vacuum-attracting attracting and holding the exposure member S. The horizontally moving table 52 is driven horizontally by a linear moving mechanism 55 including a driving motor 55a attached to the rectangular frame 51, a screw shaft 55b connected to the rotary shaft of the motor 55a and a ball nut 55c disposed in screw-coupling with the screw shaft 55b and secured to the horizontally moving table 52. Further, the vertically moving table 53 is also driven vertically by a linear moving mechanism 56 formed of a driving motor 56a attached to the horizontally moving table 52, a screw shaft 56b connected to the rotary shaft of the motor 56a and a ball nut 56c disposed in screw-coupling with the screw shaft 56b and secured to the vertically moving table 53. A constant tension spring 58 is wound around a bracket 57 attached to the upper end of the horizontally moving table 52 and engaged at one end to the upper end of the vertically moving table 53 to support the weight of the vertically moving table 53, the holding chuck 54 and the exposure member S. The holding chuck 54 includes positioning pins 54a, 54b and 54c for positioning the lower end and the rear end of the exposure member S, and a clamping member (not illustrated) for clamping the upper end of the exposure member S. The exposure member S is, for example, a large sized glass plate of 700 mm × 800 mm for a liquid crystal display. A photoresist is coated on the exposure surface of the exposure member S.

Figure 9:
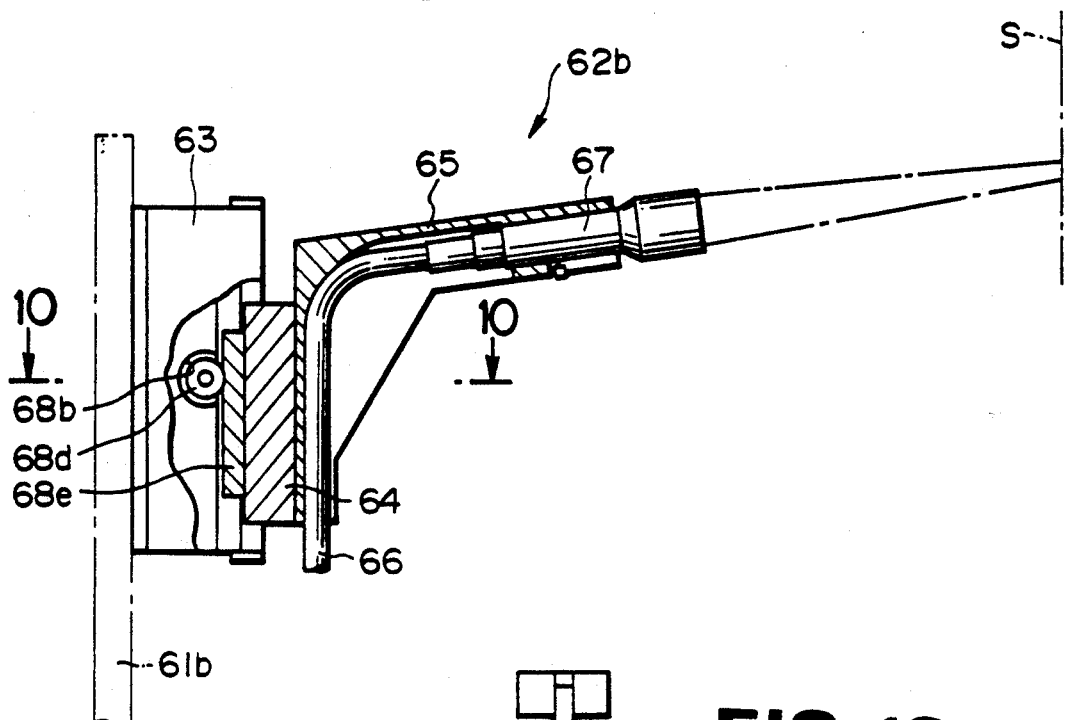
FIG. 9 is a side elevational view, partially in cross section, illustrating an illumination mechanism shown generally in FIG. 1.
Figure 10:
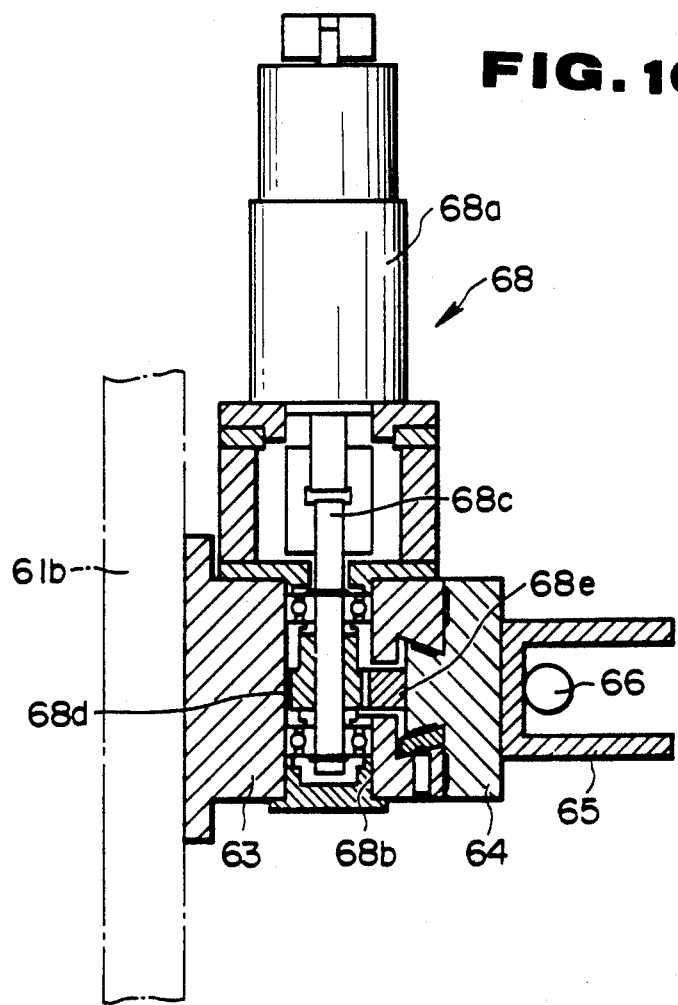
FIG. 10 is a cross sectional view generally taken along line 10—10 in FIG. 9.

The illumination mechanism 60 includes a pair of vertically movable illumination devices 62a and 62b, FIG. 1, attached, respectively, to support plates 61a and 61b disposed to the right of the projection lens PL in the casing 22. Each of the illumination devices 62a and 62b includes, as shown in FIGS. 9 and 10, a substrate block 63 attached to the right end surface for each of the support plates 61a and 61b, a sliding block 64 held vertically and slidably on the substrate block 63, a generally L-shaped support member 65 secured to the right end surface of the sliding block 64 and a lens cylinder 67 supported on the support member 65 and incorporating a plurality of condenser lenses connected with one end of an optical fiber 66. The other end of the optical fiber receives illumination light from a halogen lamp (not illustrated). An illumination light emitted from the lens cylinder 67 is applied to the surface of the exposure member S as a spot light, for example, with a diameter of about 10 mm. The sliding block 64 is moved vertically by a driving mechanism 68 attached to the rear end of the substrate block 63. The driving mechanism 68 includes a driving motor 68a secured to the rear end of the substrate block 63, a rotary shaft 68c connected by way of a coupling to the rotary shaft of the motor and extending into a horizontal through bore 68b formed in the substrate block 63, a pinion to the outer circumferential surface of the rotary shaft 68c and a rack 68b disposed in screw-coupling with the pinion 68a and secured to the left end surface of the sliding block 64.

Figure 11:
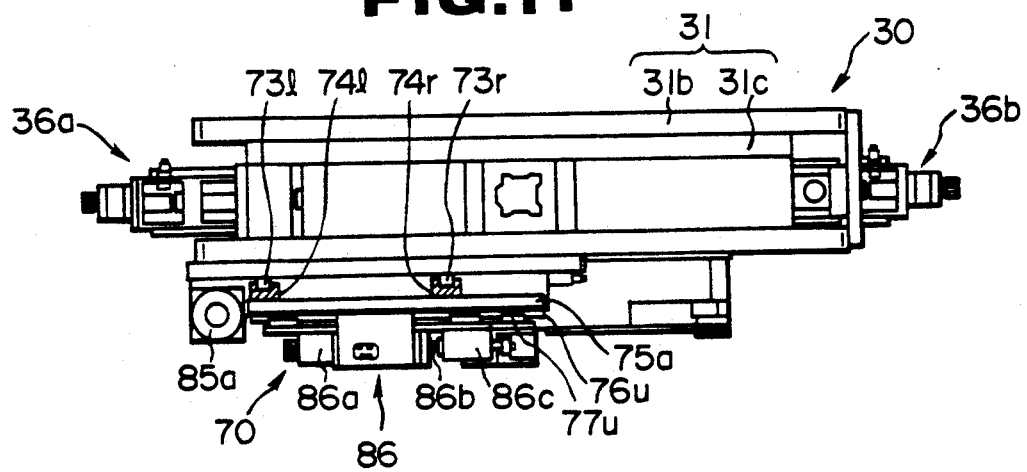
FIG. 11 is a plan view illustrating an alignment mark detection mechanism shown generally in FIGS. 2 and 3.
Figure 12:
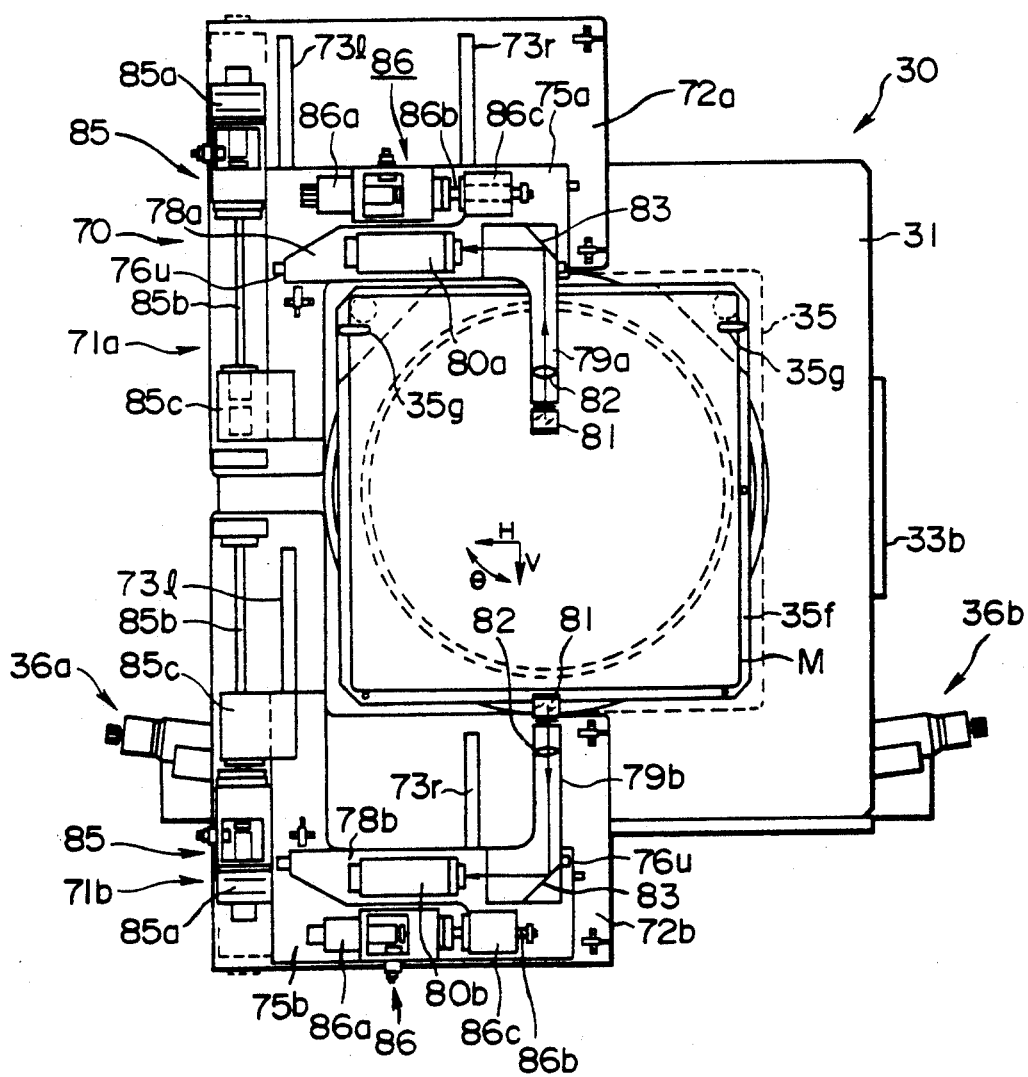
FIG. 12 is a front elevational view of FIG. 11.
Figure 13:
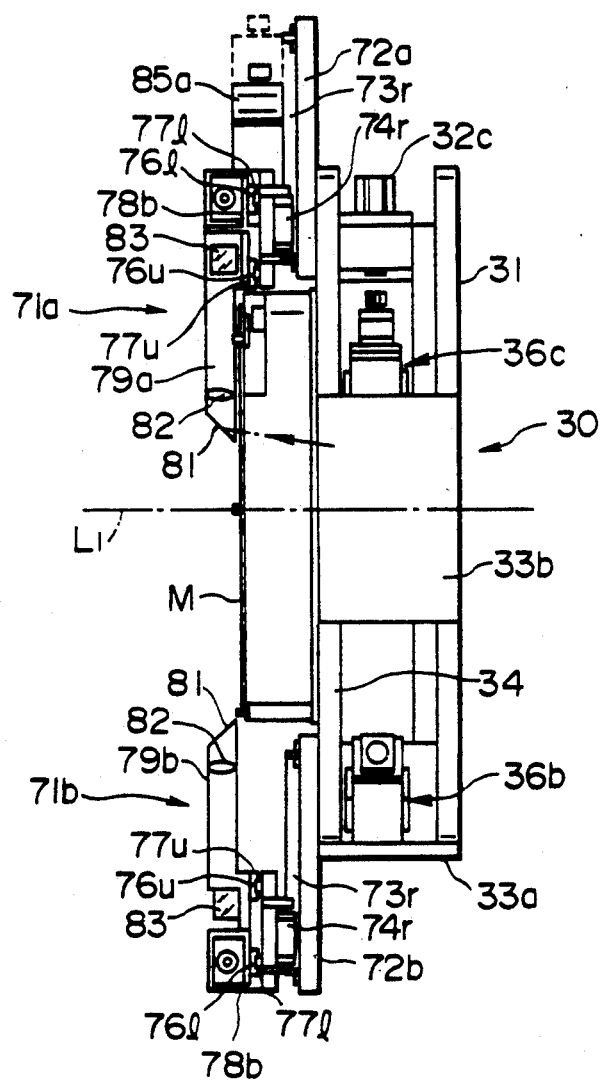
FIG. 13 is a right side elevational view of FIG. 12.

As shown in FIG. 11 through FIG. 13, the alignment mark detection mechanism 70 includes a pair of alignment detection assemblies 71a and 71b for detecting the illumination light transmitting the alignment marks $AM_{M1}$ and $AM_{M2}$ onto the mask M held by the mask holding mechanism 30. The alignment mark detection assemblies 71a and 71b, respectively, have base plates 72a and 72b secured in a vertical symmetry to the upper face plate 34 of the mask holding mechanism 30. A pair of guide rails 73l and 73r extending in the vertical direction are formed on the base plates 72a and 72b respectively. Vertically moving tables 75a and 75b are attached to sliders 74l and 74r engaging the guide rails 73l and 73r. A pair of horizontally extended guide rails 76u and 76l are disposed on the vertically moving tables 75a and 75b. Horizontally moving tables 78a and 78b are attached to sliders 77u, 77l engaging the guide rails 76u and 76l. On the horizontally moving tables 78a and 78b, light guide cylinders 79a and 79b are disposed for guiding the illumination light transmitting the alignment marks $AM_{M1}$ and $AM_{M2}$ of the mask M. Two-dimensional CCD image sensors 80a and 80b are disposed for receiving the illumination light emitted from the optical guide cylinders 79a and 79b. In this case, each of the light guide cylinders 79a and 79b contains, at its inside, a total reflection mirror 81 for vertically reflecting the illumination light transmitting the alignment marks $AM_{M1}$ and $AM_{M2}$ at the top end opposing to the mask M, a convex lens 82 for focusing the reflection light reflected by the total reflection mirror 81 and a total reflection mirror 83 for horizontally reflecting the converged light from the convex lens 82. The horizontal light reflected at the total reflection mirror 83 is focused into the CCD image sensors 80a and 80b. The vertically moving tables 75a and 75b are moved in the vertical direction by a linear moving mechanism 85 including a driving motor 85a secured to each of the base plates 72a and 72b, a screw shaft 85b connected to the rotary shaft of the motor 85a, and a ball nut 85c disposed in screw-coupling with the screw shaft 85b and secured to each of the vertically moving table 75a and 75b. Further, the horizontally moving tables 78a and 78b are also moved in the horizontal direction by a linear moving mechanism 86 formed of a driving motor 86a secured to each of the vertically moving tables 75a and 75b, a screw shaft 86b connected with the rotary shaft of the motor, and a ball nut 86 disposed in screw-coupling with the screw shaft 86b and secured to the horizontally moving tables 78a and 78b.

Figure 14:
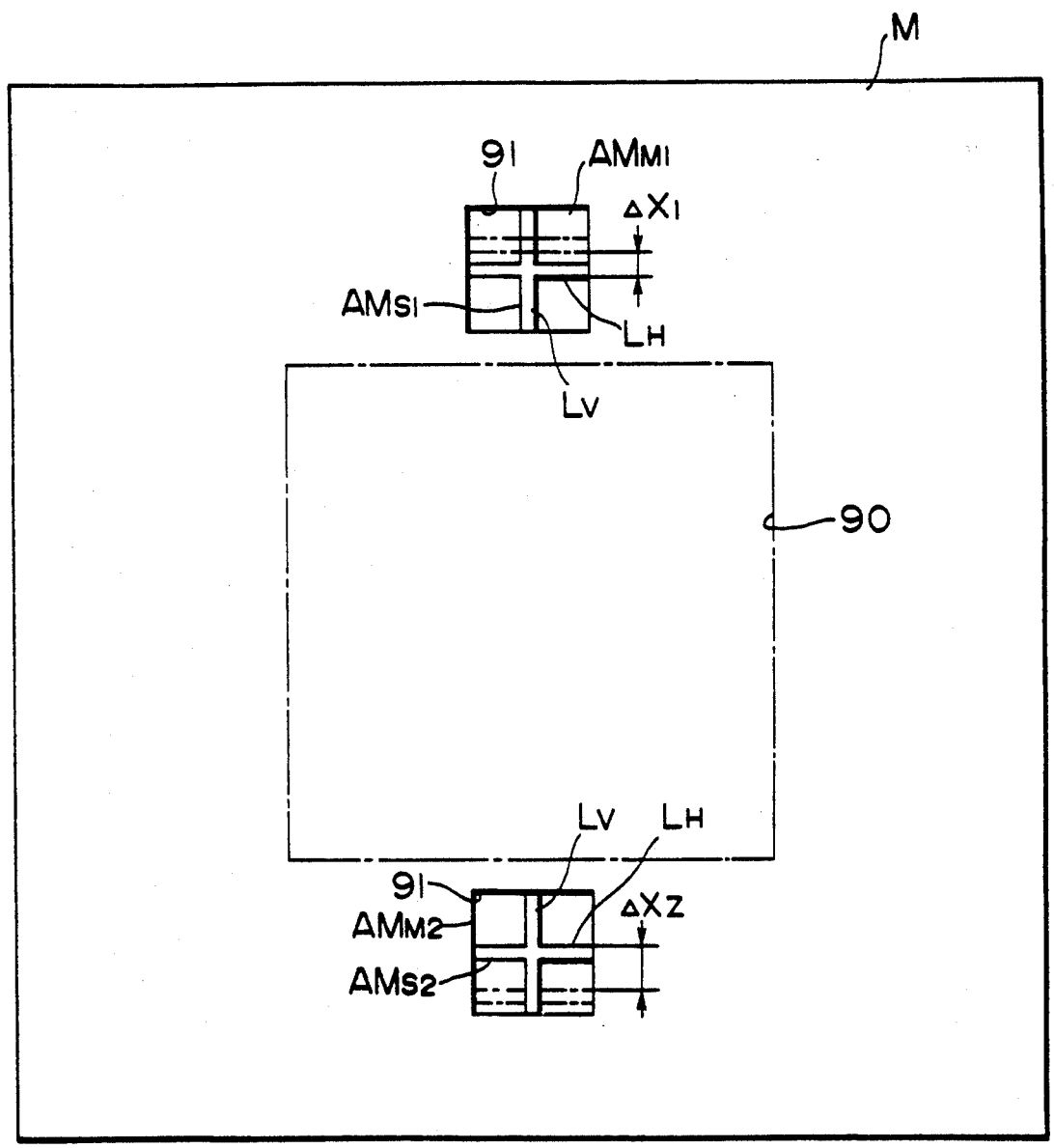
FIG. 14 is an explanatory view illustrating the alignment marks.

Further, as shown in FIG. 14, the alignment marks $AM_{M1}$ and $AM_{M2}$ formed on the mask M include square permeable apertures 91, each perforated at the upper and the lower position of the exposure pattern-forming region 90. Further, the alignment marks $AM_{S1}$ and $AM_{S2}$ formed on the exposure member S include, as shown in FIG. 14, cross symbol marks each formed at the upper and the lower positions of the pattern exposure region.

Operation of the Preferred Embodiment

The operation of the embodiment described above will now be explained. At first, the shutter 16 of the light source device 1 is closed to keep the exposure light interrupted and the mask M formed with a predetermined exposure pattern is positioned and set on the mask chuck 35d of the mask holding mechanism 30. Since the alignment mark detection assemblies 71a and 71b hinder the setting of the mask M, the linear driving mechanism 85 is activated to retract the vertically moving tables 75a and 75b upward and downward, respectively, and to retract the light guide cylinders 79a and 79b from above the mask chuck 35d.

Subsequently, after the opening/closing door 20b of the chamber 20 is opened and the exposure member S is positioned and held on the holding chuck 54 of the exposure member holding mechanism 50, the opening/closing door 21b is closed.

Then, the horizontally moving table 52 and the vertically moving table 53 of the exposure member holding mechanism 50 are moved to position a first pattern exposure region 92 on the exposure member S by the projection lens PL.

In this state, the vertically moving tables 75a and 75b of the mark detection assemblies 71a and 71b of the alignment mark detection mechanism 70 are respectively moved downward and upward to oppose the total reflection mirror 81 of the light guide cylinders 79a and 79b to the alignment marks $AM_{M1}$ and $AM_{M2}$ on the mask M, respectively. Then, the halogen lamp (not illustrated) of the illumination mechanism 60 is put ON to emit an illumination light through the lens cylinder 66 of the illumination devices 62a and 62b to the exposure member S to locally illuminate the alignment marks $AM_{S1}$ and $AM_{S2}$ of the exposure member S.

When the illumination light is thusly irradiated on the alignment marks $AM_{S1}$ and $AM_{S2}$, the illuminated images of the alignment marks $AM_{S1}$ and $AM_{S2}$ are projected through the projection lens PL to the alignment marks $AM_{M1}$ and $AM_{M2}$ of the mask M and, since the alignment marks $AM_{M1}$ and $AM_{M2}$ are permeable apertures 91, the illumination images of the alignment marks $AM_{S1}$ and $Am_{S2}$ transmitted through the permeable apertures 91 are introduced into the light guide cylinders 79a and 79b of the mark detection assemblies 71a and 71b in the alignment mark detection mechanism 70 and then focused through the inside of the light guide cylinders 79a and 79b to the CCD image sensors 80a and 80b.

Accordingly, in the CCD image sensors 80a and 80b, an image output, shown in FIG. 14, in which the alignment marks $AM_{M1}$ and $AM_{M2}$ of the mask M and the alignment marks $AM_{S1}$ and $AM_{S2}$ of the exposure member S are superposed with each other is obtained. In this case, when the distance of the vertical line $L_v$ and the horizontal line $L_H$ for the alignment marks $AM_{S1}$ and $AM_{S2}$ on the exposure member S is equal with that of the opposing sides for the alignment marks $AM_{M1}$ and $AM_{M2}$ of the mask M corresponding thereto, and the alignment marks $AM_{S1}$ and $AM_{S2}$ of the exposure member S are situated, respectively, at the central portions of the alignment marks $AM_{M1}$ and $AM_{M2}$ of the mask M, it can be confirmed that the exposure member S is aligned with the mask M, the projection lens PL is situated at an intermediate position between both of the exposure members and the mask M, and the magnifying ratio is set to 1:1.

However, when the image output from the CCD image sensors 80a and 80b is as shown by the dotted chain lines in FIG. 14, in which the alignment mark $AM_{S1}$ is displaced upward with respect to the CCD image sensor 80a and the alignment mark $AM_{S2}$ is displaced downward by an amount $\Delta X2$, which is greater than the amount $\Delta x1$ of the alignment mark $AM_{S1}$ with respect to the CCD image sensor 80b, it can be that the exposure member S and the mask M are displaced relative to each other and that the projection lens PL is situated nearer to the exposure member S with the magnifying factor being, for instance, 1.1:0.0. Therefore, the mask stage 35 is moved, for example, downward by the stage moving mechanism 36 of the mask holding mechanism 30, thereby lowering the mask M to adjust each of the alignment marks $AM_{S1}$ and $AM_{S2}$ such that the amount of displacement from the center of each of the alignment marks $AM_{M1}$ and $AM_{M2}$ is equal to each other. After the adjustment is completed, the linear moving mechanism 48 of the lens holding mechanism 40 is driven to gradually retract the projection lens PL. Thus, each of the alignment marks $AM_{S1}$ and $AM_{S2}$ moves toward the center for each of the alignment marks $AM_{M1}$ and $AM_{M2}$ and, by stopping the retraction of the projection lens PL upon reaching the central position, the magnifying ratio of the projection lens is set to 1:1.

Further, if there is an angular displacement between the mask M and the exposure member S, since the center for each of the alignment marks $S_1$ and $S_2$ of the exposure member S is detected with a clockwise or counterclockwise deviation relative to the alignment marks $AM_{M1}$ and $AM_{M2}$ of the mask M, adjustment is conducted in the rotating direction by finely rotating the mask M under the control of the vertically driving assemblies 36c of the mask holding mechanism 30.

As a result, both of the relative position between the exposure member S and the mask M, and the magnifying ratio of the projection lens PL can be adjusted simultaneously by the alignment of the alignment marks $AM_{S1}$ and $AM_{S2}$ of the exposure member S as detected by the alignment mark detection mechanism 70 with the central position for the alignment marks $AM_{M1}$ and $AM_{M2}$ of the mask M.

When the alignment between the exposure member S and the mask M has thus been completed, exposure is started by opening the shutter 16 of the light source device 1. That is, when the shutter 16 is opened, the exposure light having the wavelength component in the infrared region removed therefrom and filtered through the filter 17 into only the component of the exposure wavelength is reflected at the total reflection mirror 18. The reflection light is reflected at the concave mirror 19 in the direction of the horizontal optical axis $L_1$ and the optical image at the exit of the integrator 15 transmits the mask M which is then focused at the entrance pupil of the projection lens PL. Accordingly, the exposure pattern formed on the mask M is exposed at an equi-magnifying ratio in the exposure region of the exposure member S.

Subsequently, when the exposure of the pattern has been completed, the exposure light is interrupted by closing the shutter 16 of the optical source device 1 and then the horizontally moving table 52 (or the vertically moving table 53) of the exposure member holding mechanism 50 is moved in the horizontal (or vertical) direction to expose an adjacent new exposure region to the projection lens PL. In this state, after adjusting the relative position between the mask M and the exposure member S and adjusting the magnifying ratio for the projection lens PL again based on the result of the mark detection by the alignment mark detection mechanism 70, the shutter 16 of the light source device 1 is opened and the exposure pattern of the mask M is exposed on the exposure region of the exposure member S.

Subsequently, the exposure patterns of the mask M are exposed successively on the exposure region of the exposure member S by step-and-repeat of the exposure member holding mechanism 50. When the exposure has been completed for all of the exposure regions, the opening/closing door 20b of the chamber 20 is opened and, after releasing the vacuum attraction state of the holding chuck 54 in the exposure member holding mechanism 50, the exposure member S is taken out. Then, after positioning and holding a new exposure member S on the holding chuck 54, the opening/closing door 20b is closed and the identical exposing procedures as those described before are repeated.

In this embodiment described above, since the wavelength component in the infrared region is removed through the dichroic mirror 12 in the optical source device 1 such that the exposure light no longer contains the wavelength component in the infrared region, thermal expansion of the mask M and the exposure member S caused by the exposure light can be suppressed and, since the light source device 1 and the exposure device main body 2 are separate and independent of each other, any undesired effect of the heat generated in the light source device 1 on the exposure device main body 2 can be prevented. In addition, since the chamber 20 only has to contain the exposure device main body 2, the size of the chamber 20 can be reduced so that the initial cost and the operating cost can be reduced.

Further, as shown in the embodiment described above, since the relative position between the exposure member S and the mask M, and the magnification ratio of the projection lens PL are adjusted based on the result of the detection by the alignment mark detection mechanism 70 on every step-and-repeat of the exposure member S, superposing exposure at a high accuracy is possible even when the exposure member S and/or mask M suffers from thermal expansion.

Further, since the exposure member S is held vertically by the exposure member holding mechanism 50, torsion of the member by its own weight can be prevented such that exposure can be conducted at a high accuracy.

Furthermore, since the illumination light from the illumination mechanism 60 to the alignment marks $AM_{S1}$ and $AM_{S2}$ of the exposure member S is formed as a small spot-like shape, thermal expansion of the exposure member S owing to the illumination light can be prevented.

Further, in the embodiment described above, the light source device 1 has been described in which the exposure light emitted from the light emitting source 14 and transmitted through the integrator 15 is collected on the horizontal optical axis $L_1$ through the change of the optical axis by the total reflection mirror 18 and the concave mirror 19. However, the invention is not restricted only thereto; since the light source device may also be formed such that the exposure light emitted from the light emitting source 14 and transmitted through the integrator 14 is collected on the entrance pupil of the projection lens PL by means of two convex lenses disposed at a predetermined distance on the horizontal optical axis $L_1$.

Further, the mask holding mechanism 30, the projection lens holding mechanism 40, the exposure member holding mechanism 50, the illumination mechanism 60 and the alignment mark detection mechanism 70 forming the exposure device main body 2 are not restricted only to those shown and described in the above-mentioned embodiment as other changes or modifications may be adopted for these elements.

Furthermore, although the above-mentioned embodiment describes a case in which the projection lens PL is made movable in the direction of the horizontal optical axis $L_1$, the mask holding mechanism 30 and the exposure member holding mechanism 50 may also be constructed to be movable in the direction of the horizontal optical axis $L_1$.

A description will now be made for another embodiment of the exposure member holding mechanism 50 applicable to the present invention with reference to FIGS. 15 to 17.

This modified embodiment provides an exposure member holding mechanism 50' capable of holding a large glass plate of a reduced thickness, such as a shadow mask, as an exposure member S without causing distortion.

As shown in FIG. 15, the exposure member holding mechanism 50' includes holding chucks 101a–101d formed at four corners on the right end surface of a rectangular frame-like vertically moving table 53. Each of the holding chucks 101a–101d has vacuum attraction portions 100a–100d formed at the right end surface for attracting and holding the exposure member S, and a clamping mechanism 102 for clamping the exposure member S to be held by the holding chucks 101a–101d without distortion.

Each of the holding chucks 101a–101d is previously set such that the protruding length of the vacuum attracting portions 100a–100d, that is, the holding surface H of the exposure member S, is made constant irrespective of the thickness of exposure member S to be held.

Figure 17:
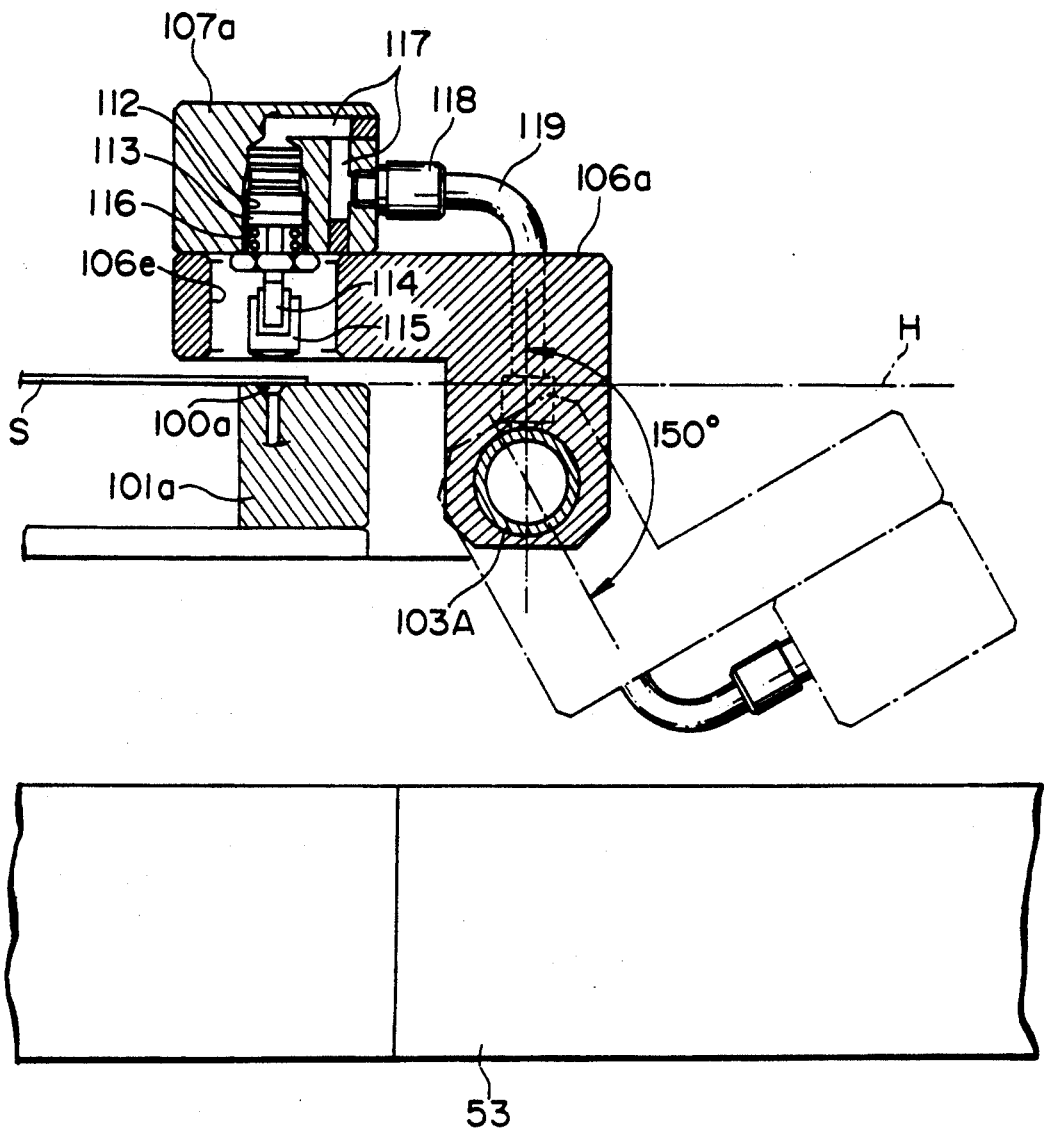
FIG. 17 is an enlarged cross sectional view of a clamping member.

As is apparent in FIGS. 16 and 17, the clamping mechanism 102 includes hollow rotational shafts 103A and 103B rotatably disposed on the left of the holding chucks 101a and 101b and on the right of the holding chucks 101c and 101d, respectively. Rotary actuators 105A and 105B are connected to the lower ends of the rotary shafts 103A and 10B by way of couplings 104A and 104B. L-shaped support members 106a–106d are secured respectively at the positions corresponding to the vacuum attraction portions 100a–100d of the holding chucks 101a–101d of the rotary shafts 103A and 103B. Clamping members 107a–107d are also mounted on the support members 105a–105d.

In this case, as shown in FIG. 16, the rotary shafts 103A and 103B have capped upper end shaft portions 108a and 108b respectively, which are inserted into and held within the perforations 110A and 110B of the sliding bearings 109A and 109B formed on the upper end surface of the holding chucks 101a and 10c. The lower ends of the shafts 103A and 103B are connected by way of couplings 104A and 104B to the rotary shafts of the rotary actuators 105A and 105B held by the support plates 111A and 111B formed on the lower end surfaces of the holding chucks 101b and 101d of the horizontally moving table 53. They are adapted so that when the rotary actuators 105A and 105B are in a retracting rotational position, the support members 106a–106d of the clamping mechanism 102 are situated on the side of the vertically moving table 53 from the holding surface of the holding chucks 101a–101d for the exposure member S and the clamping members 107a and 107d of the support members 106a–106d are opposed to the exposure member S in a direction perpendicular to the holding direction at a clamping position when the rotary actuators 105A and 105B are rotated from the retracting rotational position.

Further, as shown in FIG. 17, each of the clamping members 107a–107d is attached to the top end of the support piece 106a–106d on the side of the right end when the rotary actuators 105A and 105B are at the clamping position. A cylindrical bore 112 is formed in the horizontal direction from the side of the left end surface. A pin piston 113 is slidably disposed in the cylindrical bore 112. A rubber pad 115 in contact with the exposure member S is mounted at the top end of a piston rod 114 connected with the pin piston 113. Further, a coil spring 116 is incorporated around the piston rod 114 for resiliently biasing the pin piston 113 outwardly. The rubber pad 115 is opposed to the exposure member S through the perforation 106e formed in each of the support pieces 106a–106d. Then, an air channel 117 is formed in the cylinder bore 112 on the side opposite to the piston rod 114. The air channel 117 is connected by way of a hose elbow 118 and a hose 119 to the inside of a cavity in each of the rotary shafts 103A and 103B. The cavity in the rotary shaft 103A and 103B is connected by way of a hose elbow 120 and a hose 121 and, further, an electromagnetic directional switching valve 112 to a pressurized air supply source 123. When the electromagnetic switching valve 122 is switched on the side of the pressurized air supply source 123, the pin piston 113 moves leftward against the resiliency of the coil spring 116 at which time the rubber pad 115 abuts against the right end surface of the exposure member S to clamp the exposure member S. When the electromagnetic switching valve 122 is switched to the atmospheric side, the pin piston 113 is moved rightward by the coil spring 116 and the rubber pad 115 is spaced from the exposure S.

The operation of the embodiment described above will now be explained. In a state where the exposure member S is not held to the exposure member holding mechanism 50, the rotary actuators 105A and 105B of the clamping mechanism 102 are moved to the retracting rotational position at which time the support pieces 106a-106d of the clamp mechanism 102 are situated on the side of the vertically moving table 53 away from the holding surface of the exposure member S as shown in phantom in FIG. 17. In this state, since no protrusions are present on the side of the holding surface for the exposure member S, the exposure member S comprising a large and thin glass plate can be easily loaded or unloaded by using an appropriate loading device.

Accordingly, the loading device loads the exposure member S so that the four corners thereof correspond to the vacuum attraction portions 100a-100d of the holding chucks 101a-101d. Then, the vacuum attraction portions 100a-100d are operated to attract the exposure member S under vacuum.

Subsequently, the rotary actuators 105A and 105B are actuated and rotated to the rotating clamp position. This rotates the rotary shafts 103A and 103B by about 150°, respectively, such that the clamp members 107a-107d are opposed to the exposure member S from the orthogonal direction. In this state, the electromagnetic switching valve 122 is switched to supply pressurized air from the pressurized air supply source 123 by way of the rotary shafts 103A and 103B to the inside of the cylindrical bore 112 in each of the clamping members 107a-107d so that the piston 113 is moved to the side of the exposure member S in FIG. 17 and, correspondingly, the rubber pad 115 is brought into contact with the exposure member S from the perpendicular direction to enable positive clamping of the exposure member S.

Subsequently, after completing the clamping operation, the loading device is retracted. In this case, since the clamping mechanism 102 includes a rotary mechanism formed with rotary shafts 103A and 103B, the rotary actuators 105A and 105B for rotating the support pieces 106a-106d, and a cylinder mechanism for advancing/retracting the rubber pad 115 to the exposure member S in the perpendicular direction, the clamping force by the clamping mechanism 102 can be exerted on the exposure member S from the perpendicular direction to positively prevent the occurrence of distortion in the exposure member S caused by a clamping force exerted in the oblique direction. In this manner, a large and thin exposure member S can be positively held without distortion or strain. In addition, when the rotary actuators 105A and 105B are moved to the retracting rotational position, since each of the components constituting the clamping mechanism 102 does not protrude on the right side surface from the exposure member S held by the holding chucks 101a-101d, the exposure member S can be easily detached by the loading device.

Further, although the above-mentioned embodiment has been described wherein the inside of the rotary shafts 103A and 103B is used directly as the channel for the pressurized air, it is not necessarily restricted to only this construction and a separate air channel may be incorporated in place thereof.

Further, although an explanation has been made for the above-mentioned embodiment wherein the clamping members 107a-107d are formed of an air pressure cylinder, it is not restricted only thereto as a linear driving mechanism using a ball screw or a rack and pinion is also applicable.

Another embodiment of the exposure member holding mechanism 50 applicable to the present invention will now be described with reference to FIGS. 18–21.

This modified embodiment can provide an exposure member holding mechanism 50 capable of receiving and transferring a large and thin glass plate, such as a shadow mask, as the exposure member S by means of a loading device.

Figure 18:
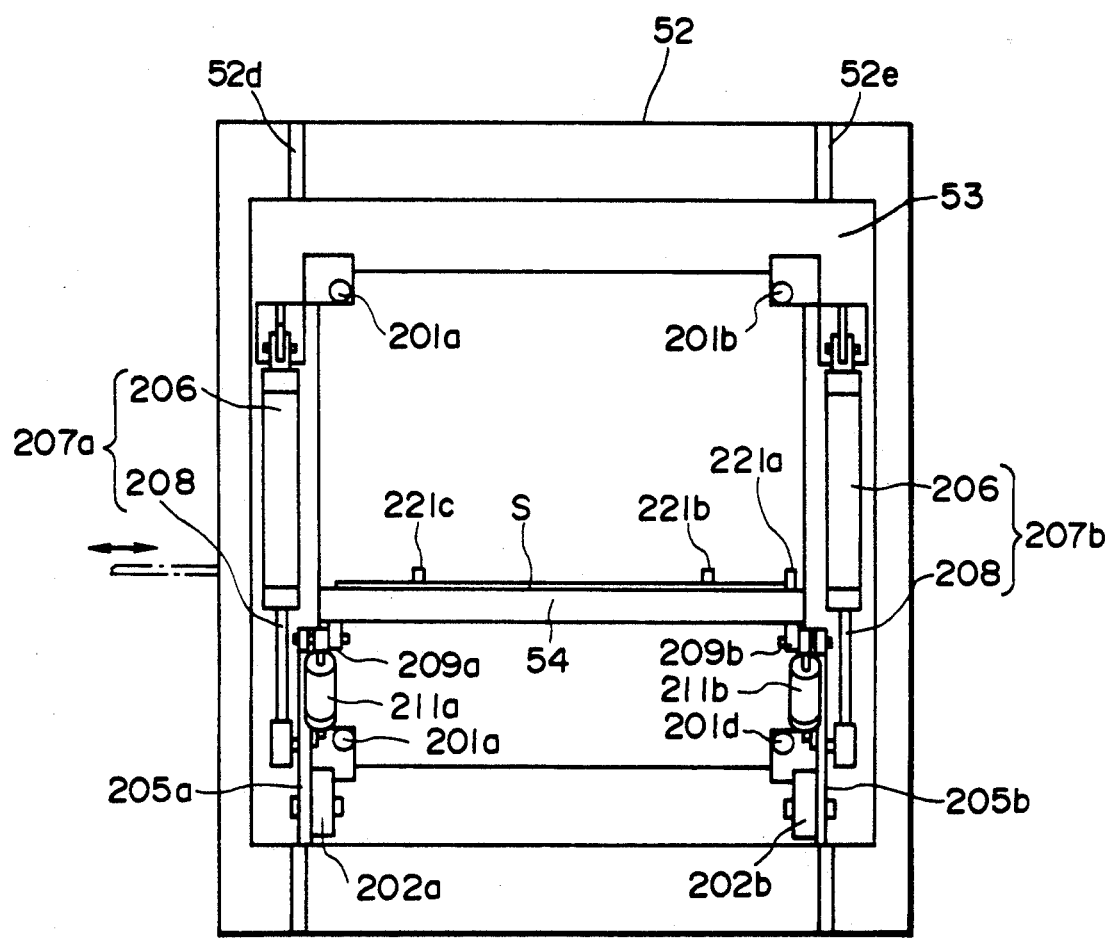
FIG. 18 is a side elevational view illustrating a further embodiment of the exposure member holding mechanism.
Figure 19:
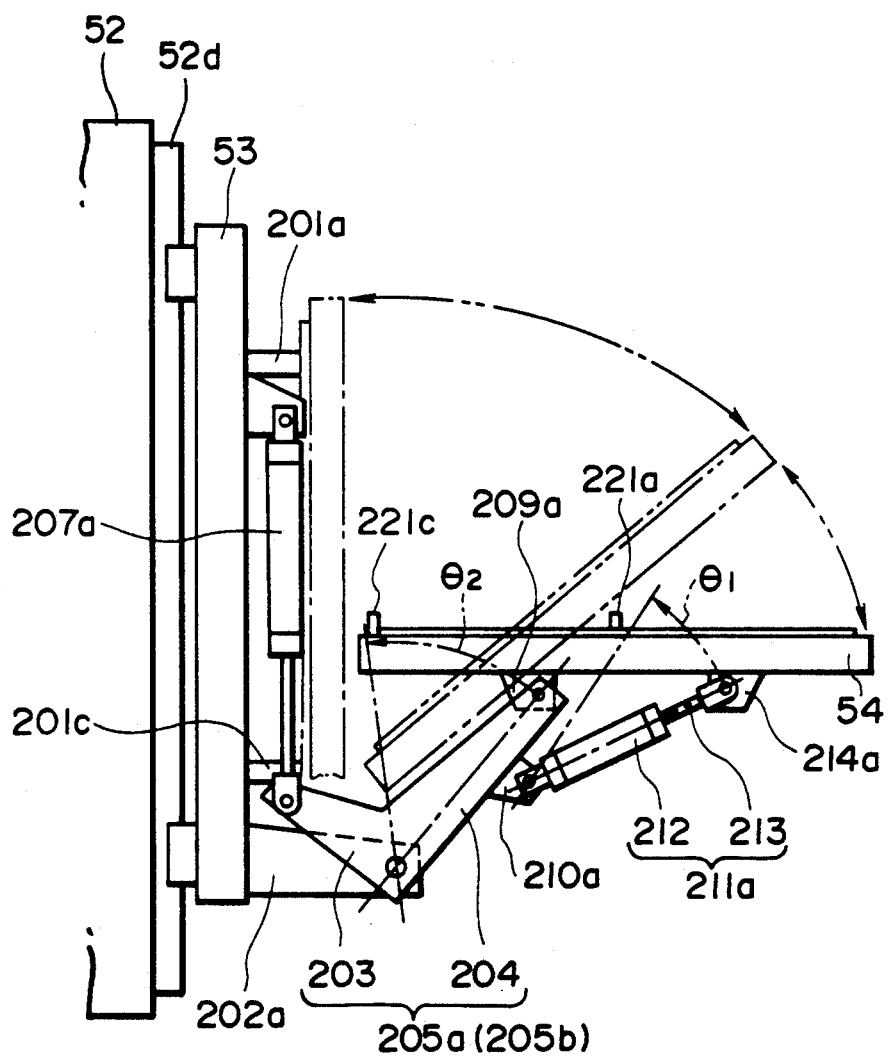
FIG. 19 is a front elevational view of the exposure member holding mechanism shown in FIG. 18.

As shown in FIGS. 18 and 19, reference stoppers 201a-201d protrude respectively from the four corners of an opening on the right end surface of a rectangular frame-like vertically moving table 53 for setting the reference position of an exposure member S. Further, two studs 202a and 202b protrude at a predetermined interval on the side of the lower end of the table 53. Each of the studs 202a and 202b has a rotary lever 205a, 205b, each comprising a relatively short arm 203 and a longer arm 204 joined with each other substantially in an L-shaped configuration and pivoted at the bent portion to each stud.

In the rotary lever 205a and 205b, a piston rod 208 of each of air cylinders 207a and 207b is pivoted to one arm 203 and the cylinder tube 206 of each cylinder is pivoted to the upper portion of the right end surface of the vertically moving table 53. The top end of the other arm 204 is pivoted to each of brackets 209a and 209b protruding below the right end surface of the holding chuck 54.

On the other hand, each of brackets 210a and 210b protrudes at the central portion on the right end of the arm 204 in each of the rotary levers 205a and 205b and a cylinder tube 212 of each of the air cylinders 211a and 211b is pivoted to each of the brackets 210a and 210b. The top end of the piston rod 213 of each of the air cylinders 211a and 211b is pivoted to each of brackets 214a and 214b protruding at the upper end on the right end surface of the holding chuck 54.

In this embodiment, the stroke of the piston rod 208 for each of the air cylinders 207a and 207b is selected to such a value that the exposed reference surface of the exposure member S is reciprocatable from the rotational position of the rotary lever 205a, 205b abutting against the reference stoppers 201a-201d as shown by the dotted chain line in FIG. 19 to a rotational position rotated by about 50° in clockwise direction as shown by the solid line in FIG. 19. The stroke of the piston rod 213 for each of the air cylinders 211a and 211b is selected to such a value that the holding chuck 54 is reciprocatable between the rotational position where the exposure member S is in a horizontal state, as shown by a solid line, and the rotational position in which it is rotated counterclockwise by about 40° from the rotational position around the bracket 209a, 209b as a fulcrum as shown by the double-dotted chain line in FIG. 19.

Figure 20:
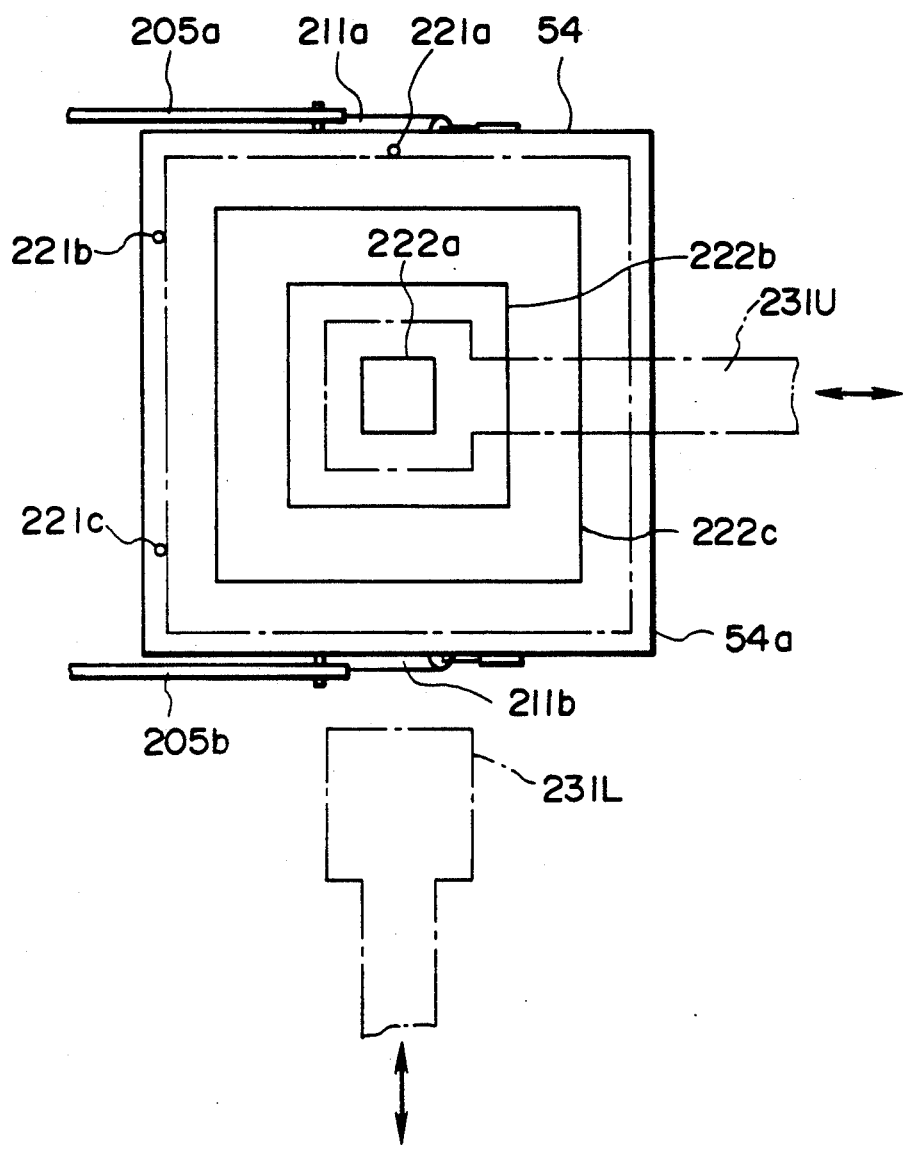
FIG. 20 is a plan view for a holding chuck.
Figure 21:
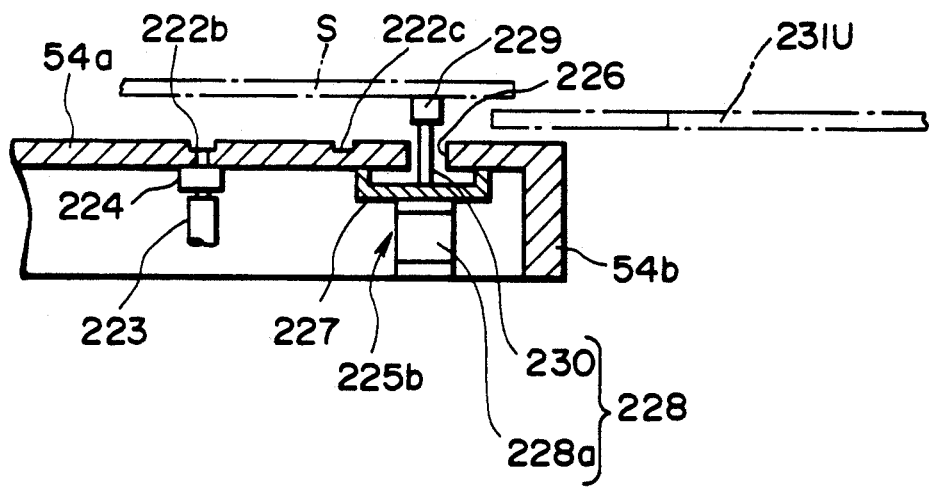
FIG. 21 is an enlarged cross sectional view of a portion of the holding chuck shown in FIG. 20.

Further, the holding chuck 54 includes, as shown in FIGS. 20 and 21, a rectangular flat plate 54a and a frame-like portion 54b extending downward from each of the side edge thereof. As shown in FIG. 20, three positioning pins 221a–221c protrude from the upper surface of the flat plate portion 54a for positioning the exposure member S. Rectangular attraction grooves 222a–222c symmetrical to each other are formed at positions covered with the exposure member S and positioned by the positioning pins 221a–221c. As shown in FIG. 21, a flexible hose 223 connected at one end to a vacuum suction source (not illustrated) is connected at its other end by way of a joint 224 from the rear side to each of the attraction grooves 222a–222c.

Further, transferring/receiving actuators 225a–225d are disposed on the flat plate portion 54a at such positions so as to be outside of the outer attraction groove 222c and covered with the exposure member S for elevating the exposure member S by a predetermined distance L from the upper surface of the flat plate portion 54a. As shown in FIG. 21, each of the receiving/transferring actuators 225a–225d has a support frame 227 disposed on the lower side of a perforation 226 formed in the flat plate portion 54a. A cylinder tube 228a of an air cylinder 228 is secured to the support frame 227. A piston rod 230 having a support piece 229, such as one made of rubber and attached at the top end of the air cylinder 228 for receiving the exposure member S, is disposed vertically and retractably through the perforation 226.

Then, as shown in FIGS. 20 and 21, a loading transfer arm 231L and an unloading transfer arm 231u shown by the dotted chain line and each constituting the loading mechanism and having a vacuum attraction groove formed on the upper surface are opposed to each other and retractably disposed between the upper surface of the flat plate portion 54a in the horizontal state. The exposure member S is elevated by the receiving/transferring actuators 225a–225d.

In this embodiment, the holding chuck 54 takes a substantially horizontal position as shown by the solid line in FIG. 19 in a state where the piston rod 208 for each of the air cylinders 207a and 207b is retracted, and while the piston rod 213 for each of the air cylinders 211a and 211b is retracted. In this state, the exposure member S is advanced while being held by vacuum attraction to the upper surface of the loading transfer arm 231L and the forward edge and the right side edge of the exposure member S are abutted respectively against the positioning pins 221a–221c. Then, the vacuum attraction state of the exposure member S by the loading transfer arm 231L is released and, subsequently, the piston rod 230 for each of the receiving/transferring actuators 225a–225d is extended. Thus, the support piece 229 of the piston rod 230 abuts against the lower surface of the exposure member to separate it upward from the loading transfer arm 231L.

After retracting the loading transfer arm 231L backward in this state, the piston rod 230 for each of the receiving/transfer actuators 225a–225d is retracted to bring the exposure member S into contact with the upper surface of the flat portion 54a of the holding chuck 54 and, at the same time therewith or after a delay, each of the attraction grooves 222a–222c is connected by means of the joint 221 and the flexible force 220 to a vacuum attraction source to thereby hold the exposure member S by vacuum attraction.

In this way, when the exposure member S is held by attraction by the holding chuck 54, the piston rod 213 for each of the air cylinders 211a and 211b is at first extended to rotate the holding chuck 54 counterclockwise by an angle of $\theta_1$ (about 40°) around each of the brackets 209a and 209b as a fulcrum. Then, the piston rod 208 for each of the air cylinders 207a and 207b is extended to rotate each of the rotary levers 205a and 205b counterclockwise by an angle of $\theta_2$ (about 50°). The holding chuck 54 thus stands substantially upright and the surface of the exposure member S held under attraction by the holding chuck 54 is abutted against each of the reference stoppers 201a–201d formed on the vertically moving table 53 and the exposed surface of the exposure member S is positioned to the reference exposure plane.

In this case, the holding chuck 54 is rotated by the two sets of the air cylinders 207a, 207b and the air cylinders 211a, 211b from the horizontal state to the vertical state so that the exposure member S is abutted against the reference stoppers 201a–201d. Since the rotary levers 205a–205d and the holding chuck 54 have no stoppers for regulating their rotational positions, when the actuation power for each of the air cylinders 207a and 207b is, for example, set greater than that for each of the air cylinders 211a and 211b, even in a case where the upper end of the exposure member S initially abuts only against the reference stoppers 201a and 201b, the piston rod 213 for each of the air cylinders 211a and 211b is retracted to abut the lower end of the exposure member S against the reference stoppers 201c and 201d. Since the actuation power for each of the air cylinders 207a and 207b is greater, the exposure member S can be surely abutted to all of the reference stoppers 201a–201d and aligned exactly with the reference exposure surface.

Subsequently, when the exposure to the exposure member S has been completed, the piston rod 208 for each of the air cylinders 207a and 207b is at first retracted and then each of the air cylinders 211a and 211b is retracted to return the holding chuck 54 to the horizontal state shown by the solid line in FIG. 19. Then, the vacuum attraction state for the exposure member S is released by disconnecting each of the attraction grooves 222a–222c from a vacuum attraction source and, at the same time therewith or after a delay, the receiving/transferring actuators 225a–225d are operated to extend the piston rod 230 for the air cylinder 228 and separate the exposure member S by a predetermined distance from the surface of the holding chuck 54. Then, the unloading transfer arm 231U is inserted between the holding chuck 54 and the exposure member S. When the arm 231U has been completely inserted, the receiving/transferring actuators 225a–225d are deactivated and the exposure member S is placed on the unloading transfer arm 231U. After vacuum-attracting the exposure member S to the transfer arm 231U in this state, the transfer arm 231U is returned to the original position to complete the unloading for the exposure member S.

Subsequently, a new exposure member S is moved by the loading transfer arm 231L onto the holding chuck 54 and the exposure member S is exposed by repeating the same procedure described above.

As has been described above, according to this embodiment, since the holding chuck 54 is adapted to make the exposure member S rotatable between the exposure position in which the exposure member S is aligned with the vertical reference exposure surface and a receiving/transferring position in which the exposure member S carried on the holding chuck is in a horizontal state, the exposure member S can be easily received/transferred to provide a device capable of utilizing the existent loading mechanism used in the exposure device of a type having a vertical optical axis without modification. Further, since the holding chuck 54 is rotated by using two sets of the air cylinders, it is possible to exactly position the exposure member S to the reference exposure surface by the cushioning effect of the air cylinders.

Although the embodiment shown in FIG. 18-21 has been described as using two sets of air cylinders, the air cylinders may be replaced with other actuators of less cushioning effects, such as hydraulic cylinders, or linear moving mechanisms, such as ball screws, and resilient members, such as springs, having cushioning effect may be interposed between such actuators and the rotary levers 205a and 205b and the holding chuck 54.

Further, although a description has been made for the embodiment shown in FIGS. 18-21 in which the air cylinders 207a and 207b are employed as the actuators for rotating the rotary levers 205a and 205b, other rotary driving mechanisms, such as air motors or electric motors, may also be used.

Furthermore, although an explanation has been made for the embodiment shown in FIG. 19-FIG. 21 wherein the loading direction and unloading direction for the exposure member are different from each other, the present invention is not restricted only thereto as both of the loading and unloading directions may be identical or loading and unloading can be conducted in any optional direction.

Figure 22:
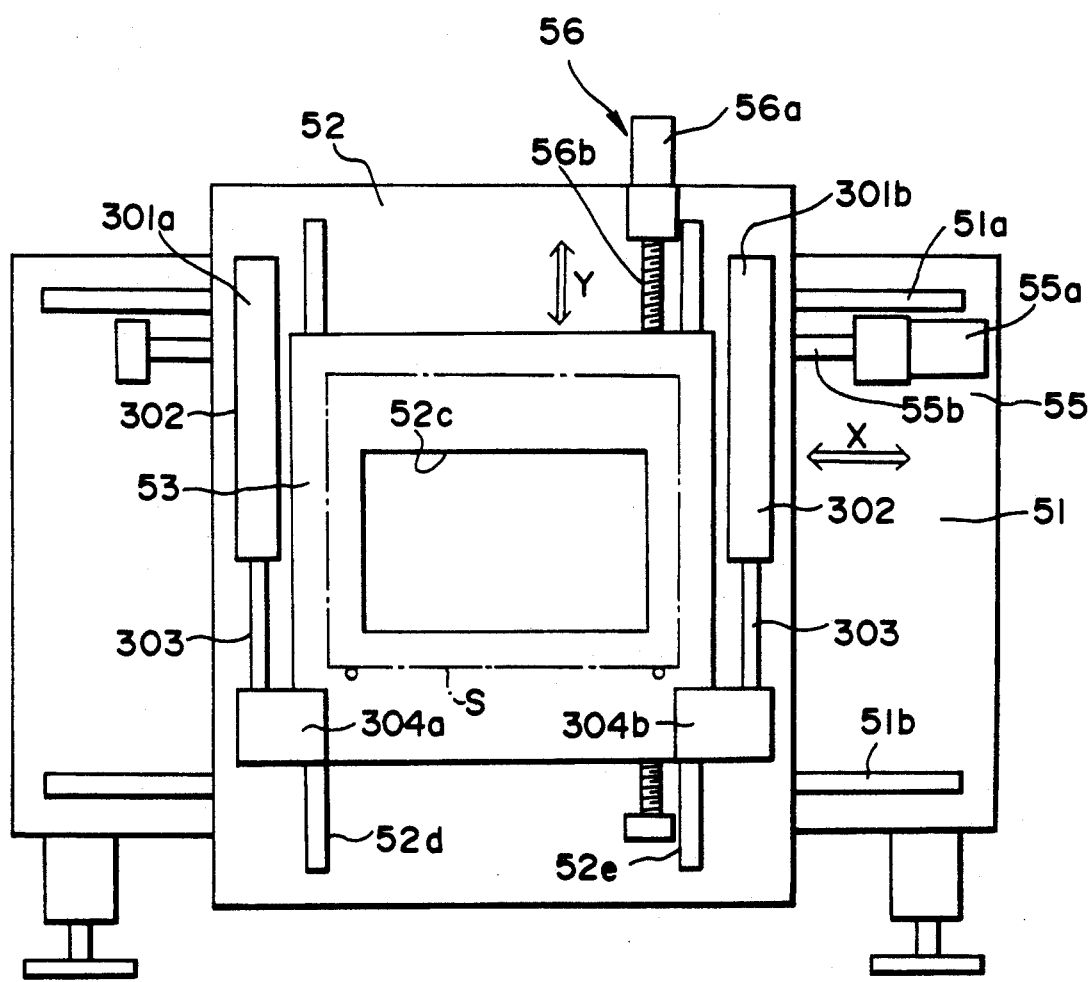
FIG. 22 is a side elevational view illustrating a still further embodiment of the exposure member holding mechanism.

Although explanations have been made in each of the foregoing embodiments as to the case of disposing the constant tension spring 5 between the horizontally moving table 52 and the vertically moving table 53 to support the weight of the vertically moving table 53, the holding chuck 54 and the exposure member S, the present invention is not restricted only thereto. Instead of the constant tension spring 58, as shown in FIG. 22, cylinder tubes 302 of air cylinders 301a and 301b for counter balance are disposed respectively on the right and left end edges of the horizontally moving table 52 and piston rods 303 of the air cylinders 301a and 301b are engaged respectively with protrusions 304a and 304b formed on the vertically moving table 53. The air cylinders 301a and 301b are connected by way of air restriction valves (not illustrated) to an air supply source so that the counter balance is adjusted with the pressure of the supplied air and the damping force is generated from the restriction valve.

Figure 23:
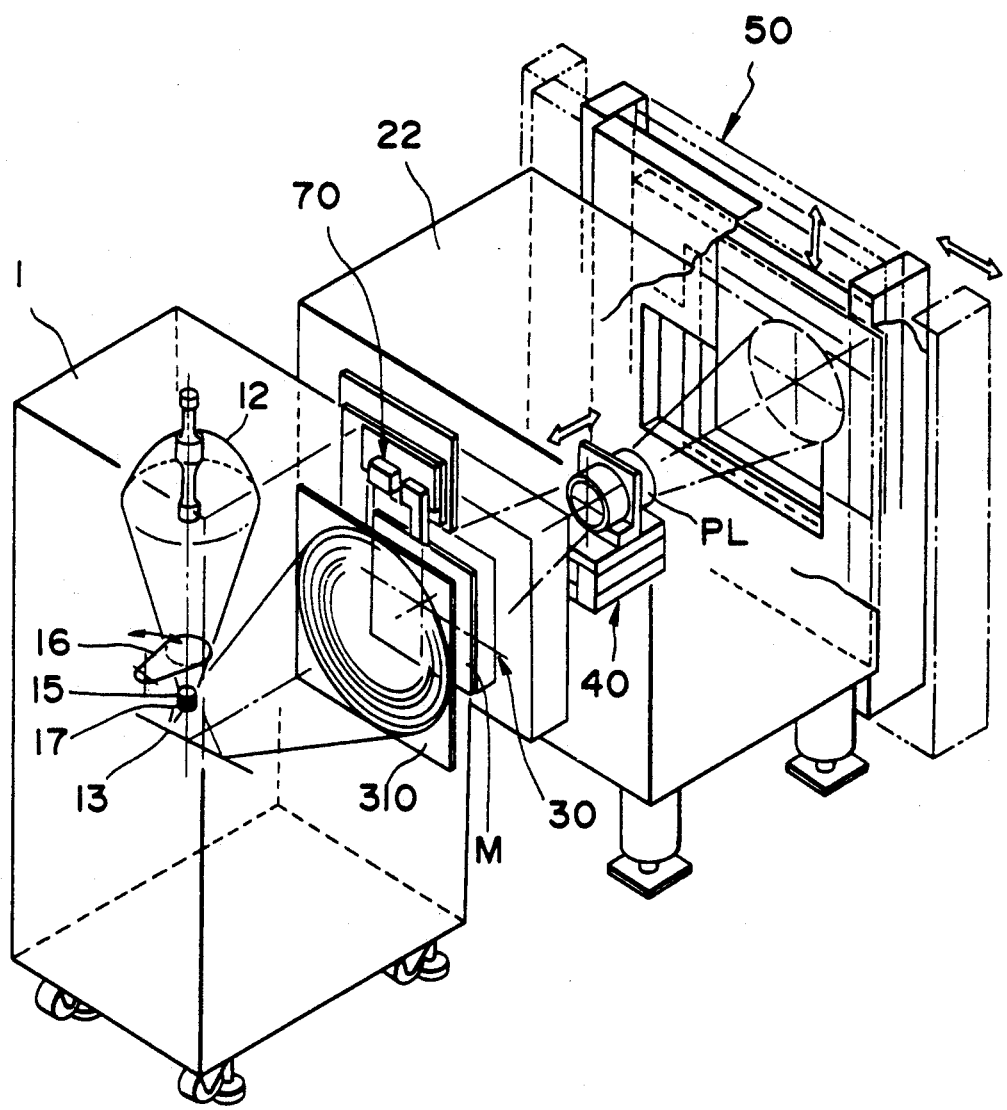
FIG. 23 is a perspective view illustrating a further embodiment of a light source device.

Further, although explanations have been made for each of the foregoing embodiments in which the exposure light made uniform by the integrator 15 is collected by the optical axis changing means including the total reflection mirror 18 and the concave mirror 19 in the light source device 1, the present invention is not restricted only thereto. As shown in FIG. 23, the light source device may include a light source 12, such as a mercury lamp or a xenon lamp, for emitting light downwardly, a dichroic mirror 13 applied with the exposure light from the light source by way of a shutter 16, a filter 17 which allows the transmission of only the light at an exposure wavelength (for example, g-rays) and reflects the same in the direction of the horizontal optical axis $L_1$, and a Fresnel lens 310 for focusing an illuminated optical image on the dichroic mirror 13 to the entrance pupil P of a projection lens PL. In this case, since the total reflection mirror 18 for changing the optical axis in the light source device 1 shown in FIG. 1 can be eliminated and the Fresnel lens 310 is used instead of the concave mirror 19, the structure can be simplified to save space and, further, production costs can be reduced. Furthermore, the effect in the direction of the optical axis caused by mounting error is not as significant as in the case of using the concave mirror and, further, the operation for attaching the Fresnel lens is facilitated.

As has been described above, since the projection exposure device according to the present invention has been so constituted that the exposure light is emitted from the light source device along the horizontal optical axis and then irradiated by way of the mask and the projection lens disposed on the horizontal optical axis to the exposure member so that an exposure pattern of the mask is exposed on the exposure member, distortion of the exposure member by its own weight can be prevented by holding the exposure member in the vertical state as compared with the existent device which holds the member in the horizontal state thereby enabling exposure to be conducted at a high accuracy. In addition, since the holding mechanism holds the exposure member movably within a plane perpendicular to the horizontal optical axis, the exposure member can be put through a step-and-repeat process and an exposure pattern can be exposed on a plurality of areas thereby improving the throughput of the exposure device.

Further, since the projection lens is disposed at a central position between the mask and the exposure member and the mask and the exposure member are movable independent of each other within a plane perpendicular to the horizontal optical axis, the relative position between the exposure member and the mask and the magnifying ratio can be adjusted with ease to enable pattern exposure at a high accuracy.

Furthermore, since the light source device is independently disposed, a light emitting source is disposed for emitting the exposure light after removing the wavelength component in the infrared region, the optical axis for the exposure light made uniform by such combination is changed by the optical axis changing means and, further, the exposure light is collected through the concave mirror on the horizontal optical axis, it is possible to reduce the size of the light source device, to suppress the thermal expansion of the exposure member by preventing the effect of heat generated in the light source device on the exposure member, as well as to suppress the thermal expansion of the exposure member itself by the exposure light. Furthermore, since it is only necessary for the chamber to contain the mask, the projection lens and the exposure member, it is possible to reduce the size of the chamber and, thereby, reduce the initial cost and the operating cost of the device.

What is claimed is:

1. A projection exposure device in which an exposure light from a light source device is transmitted through a mask having a predetermined pattern formed therein and then an image of a mask pattern is focused by a projection lens on an exposure member held by a holding mechanism, the projection exposure device comprising:

means for emitting an exposure light from the light source device along a horizontal optical axis;

the mask, the projection lens and the exposure member being disposed on the horizontal optical axis;

the holding mechanism holds the exposure member such that the exposure member is movable at least within a plane perpendicular to the horizontal optical axis; and the light source device includes:
- a truck movable independently in the direction of the horizontal optical axis;
- a light emitting source, mounted on the truck, for emitting an exposure light of a wavelength shorter than that of infrared light;
- an integrator, mounted on the truck, for making the light emitted from the light emitting source uniform;
- an optical axis changing means, mounted on the truck, for changing the optical path of the light emitted from the integrator; and
- a concave mirror, mounted on the truck, for collecting the light from the optical axis changing means and reflecting the same in the direction of the horizontal optical axis.

2. A projection exposure device in which an exposure light from a light source device is transmitted through a mask having a predetermined pattern formed therein and then an image of a mask pattern is focused by a projection lens on an exposure member held by a holding mechanism, the projection exposure device comprising:

means for emitting an exposure light from the light source device along a horizontal optical axis;

the mask, the projection lens and the exposure member being disposed on the horizontal optical axis;

the holding mechanism holds the exposure member such that the exposure member is movable at least within a plane perpendicular to the horizontal optical axis; and the light source device includes:
- a truck independently movable in the direction of the horizontal optical axis;
- a light emitting source, mounted on the truck, for emitting an exposure light with a wavelength shorter than that of infrared light;
- an integrator, mounted on the truck, for making the light emitted from the light emitting source uniform;
- an optical axis changing means, mounted on the truck, for changing the optical path of the light emitted from the integrator into the direction of the horizontal optical axis; and
- a Fresnel lens, mounted on the truck, for projecting an illuminated optical image from the optical axis changing means into an entrance pupil of the projection lens.

3. In a projection exposure device in which an exposure light from a light source device is transmitted along a horizontal optical axis through a mask having a predetermined exposure pattern formed therein and supported by a mask holding mechanism and then an image of the exposure pattern is focused by a projection lens on an exposure member held by an exposure member holding mechanism so as to be movable at least in a plane orthogonal to the horizontal optical axis, the improvement in which the light source device comprises:

a light emitting source mounted on a truck for emitting an exposure light of a wavelength shorter than that of infrared light, the truck being movable in a direction of the horizontal optical axis independently of an exposure device main body including the mask, the projection lens, and the exposure member holding mechanism;

an integrator for making the light emitted from the light emitting source uniform;

an optical axis changing means for changing an optical path of light exiting from the integrator; and converging means for collecting the light from the optical axis changing means and reflecting the same in the direction of the horizontal optical axis to thereby project the light into an entrance pupil of the projection lens.

4. The improvement in a projection exposure device according to claim 3, wherein the optical axis changing means comprises a total reflection mirror for totally reflecting the light exiting from the integrator; and the converging means comprises a concave mirror for collecting the reflected light from the total reflection mirror and for projecting the collected light into the entrance pupil of the projection lens.

5. The improvement in a projection exposure device according to claim 4, wherein the exposure device main body is independent of the optical source device and comprises a casing disposed within a chamber, the casing including the mask holding mechanism for holding the mask formed at a front end of the casing on the horizontal optical axis;

the exposure member holding mechanism for holding the exposure member formed at a rear end of the casing; and the projection lens holding mechanism for holding the projection lens disposed between the front end of the casing to the rear end of the casing.

6. The improvement in a projection exposure device according to claim 4, wherein the projection lens holding mechanism includes:

a base mounted within the casing;

a pair of leaf springs disposed on an upper surface of the base spaced from each other by a predetermined interval in the direction of the horizontal optical axis;

a movable plate fixed to upper ends of the leaf springs; and projection lens driving means for moving the movable plate in the direction of the horizontal optical axis;

the projection lens being mounted on the movable plate with an optical axis of the projection lens coincident with the horizontal optical axis.

7. The improvement in a projection exposure device according to claim 4, wherein:

the exposure member holding mechanism includes a horizontal moving mechanism and a vertical moving mechanism for guiding and driving a holding chuck having the exposure member mounted thereon in two-dimensional directions, both in a horizontal direction and in a vertical direction;

the vertical moving mechanism including tension means for cancelling a weight of the holding chuck.

8. The improvement in a projection exposure device according to claim 3, wherein the optical axis changing means comprises a dichroic mirror for reflecting the light exiting from the integrator; and the converging means comprises a Fresnel lens for collecting the light reflected from the dichroic mirror and for projecting the collected light into the entrance pupil of the projection lens.

9. The improvement in a projection exposure device according to claim 8, wherein the exposure device main body is independent of the optical source device and comprises a casing disposed within a chamber, the casing including the mask holding mechanism for holding the mask formed at a front end of the casing on the horizontal optical axis;

the exposure member holding mechanism for holding the exposure member formed at a rear end of the casing; and the projection lens holding mechanism for holding the projection lens disposed between the front end of the casing to the rear end of the casing.

10. The improvement in a projection exposure device according to claim 8, wherein the projection lens holding mechanism includes:

a base mounted within the casing;

a pair of leaf springs disposed on an upper surface of the base spaced from each other by a predetermined interval in the direction of the horizontal optical axis;

a movable plate fixed to upper ends of the leaf springs; and projection lens driving means for moving the movable plate in the direction of the horizontal optical axis;

the projection lens being mounted on the movable plate with an optical axis of the projection lens coincident with the horizontal optical axis.

11. The improvement in a projection exposure device according to claim 8, wherein:

the exposure member holding mechanism includes a horizontal moving mechanism and a vertical moving mechanism for guiding and driving a holding chuck having the exposure member mounted thereon in two-dimensional directions, both in a horizontal direction and in a vertical direction;

the vertical moving mechanism including tension means for cancelling a weight of the holding chuck.

12. The improvement in a projection exposure device according to claim 8, wherein the exposure member holding mechanism includes:

a holding chuck for attracting and holding the exposure member; and a clamp mechanism for sandwiching the exposure member held by the holding chuck; and wherein the clamp mechanism includes:

a clamp rotating mechanism provided on a side of the holding chuck; and a clamp member having a pin-piston;

the pin-piston being rotated by the clamp rotating mechanism between a clamp position at which the pin-piston opposes the exposure member from a vertical direction and a non-clamp position which is lower than a loading surface and an unloading surface of the exposure member;

the pin-piston being capable of opposing the exposure member from the vertical direction at the clamp position.

13. The improvement in a projection exposure device according to claim 3, wherein the exposure device main body is independent of the optical source device and comprises a casing disposed within a chamber, the casing including the mask holding mechanism for holding the mask formed at a front end of the casing on the horizontal optical axis;

the exposure member holding mechanism for holding the exposure member formed at a rear end of the casing; and the projection lens holding mechanism for holding the projection lens disposed between the front end of the casing to the rear end of the casing.

14. The improvement in a projection exposure device according to claim 13, wherein the projection lens holding mechanism includes:

a base mounted within the casing;

a pair of leaf springs disposed on an upper surface of the base spaced from each other by a predetermined interval in the direction of the horizontal optical axis;

a movable plate fixed to upper ends of the leaf springs; and projection lens driving means for moving the movable plate in the direction of the horizontal optical axis;

the projection lens being mounted on the movable plate with an optical axis of the projection lens coincident with the horizontal optical axis.

15. The improvement in a projection exposure device according to claim 13, wherein:

the exposure member holding mechanism includes a horizontal moving mechanism and a vertical moving mechanism for guiding and driving a holding chuck having the exposure member mounted thereon in two-dimensional directions, both in a horizontal direction and in a vertical direction;

the vertical moving mechanism including tension means for cancelling a weight of the holding chuck.

16. The improvement in a projection exposure device according to claim 13, wherein the exposure member holding mechanism includes:

a holding chuck for attracting and holding the exposure member; and a clamp mechanism for sandwiching the exposure member held by the holding chuck; and wherein the clamp mechanism includes:

a clamp rotating mechanism provided on a side of the holding chuck; and a clamp member having a pin-piston;

the pin-piston being rotated by the clamp rotating mechanism between a clamp position at which the pin-piston opposes the exposure member from a vertical direction and a non-clamp position which is lower than a loading surface and an unloading surface of the exposure member;

the pin-piston being capable of opposing the exposure member from the vertical direction at the clamp position.

17. The improvement in a projection exposure device according to claim 13 wherein:

the exposure member holding mechanism includes a holding chuck rotating mechanism for rotating the holding chuck which attracts and holds the exposure member between an exposure position orthogonal to the horizontal optical axis and a mounting and demounting position in parallel with the horizontal optical axis;

and wherein the holding chuck rotating mechanism includes a rotating lever for rotatably holding the holding chuck by a first air cylinder; and a second air cylinder for rotating the holding chuck between the rotating lever and the first air cylinder.

18. The improvement in a projection exposure device according to claim 13, wherein:

the holding chuck includes an exchange mechanism for forming a gap for inserting the unloading mounting arm, the gap being formed by floating the exposure member from an upper portion of the holding chuck by a predetermined interval at the time of unloading of the exposure member.

19. The improvement in a projection exposure device according to claim 3, wherein the projection lens holding mechanism includes:

a base mounted within the casing;

a pair of leaf springs disposed on an upper surface of the base spaced from each other by a predetermined interval in the direction of the horizontal optical axis;

a movable plate fixed to upper ends of the leaf springs; and projection lens driving means for moving the movable plate in the direction of the horizontal optical axis;

the projection lens being mounted on the movable plate with an optical axis of the projection lens coincident with the horizontal optical axis.

20. The improvement in a projection exposure device according to claim 19, wherein:

the exposure member holding mechanism includes a horizontal moving mechanism and a vertical moving mechanism for guiding and driving a holding chuck having the exposure member mounted thereon in two-dimensional directions, both in a horizontal direction and in a vertical direction;

the vertical moving mechanism including tension means for cancelling a weight of the holding chuck.

21. The improvement in a projection exposure device according to claim 3, wherein:

the exposure member holding mechanism includes a horizontal moving mechanism and a vertical moving mechanism for guiding and driving a holding chuck having the exposure member mounted thereon in two-dimensional directions, both in a horizontal direction and in a vertical direction;

the vertical moving mechanism including tension means for cancelling a weight of the holding chuck.

22. The improvement in a projection exposure device according to claim 21, wherein the exposure member holding mechanism includes:

a holding chuck for attracting and holding the exposure member; and a clamp mechanism for sandwiching the exposure member held by the holding chuck; and wherein the clamp mechanism includes:

a clamp rotating mechanism provided on a side of the holding chuck; and a clamp member having a pin-piston;

the pin-piston being rotated by the clamp rotating mechanism between a clamp position at which the pin-piston opposes the exposure member from a vertical direction and a non-clamp position which is lower than a loading surface and an unloading surface of the exposure member;

the pin-piston being capable of opposing the exposure member from the vertical direction at the clamp position.

23. The improvement in a projection exposure device according to claim 21, wherein:

the exposure member holding mechanism includes a holding chuck rotating mechanism for rotating the holding chuck which attracts and holds the exposure member between an exposure position orthogonal to the horizontal optical axis and a mounting and demounting position in parallel with the horizontal optical axis;

and wherein the holding chuck rotating mechanism includes a rotating lever for rotatably holding the holding chuck by a first air cylinder; and a second air cylinder for rotating the holding chuck between the rotating lever and the first air cylinder.

24. The improvement in a projection exposure device according to claim 21, wherein:

the holding chuck includes an exchange mechanism for forming a gap for inserting the unloading mounting arm, the gap being formed by floating the exposure member from an upper portion of the holding chuck by a predetermined interval at the time of unloading of the exposure member.

25. The improvement in a projection exposure device according to claim 3 wherein the exposure member holding mechanism includes:

a holding chuck for attracting and holding the exposure member; and a clamp mechanism for sandwiching the exposure member held by the holding chuck; and wherein the clamp mechanism includes:

a clamp rotating mechanism provided on a side of the holding chuck; and a clamp member having a pin-piston;

the pin-piston being rotated by the clamp rotating mechanism between a clamp position at which the pin-piston opposes the exposure member from a vertical direction and a non-clamp position which is lower than a loading surface and an unloading surface of the exposure member;

the pin-piston being capable of opposing the exposure member from the vertical direction at the clamp position.

26. The improvement in a projection exposure device according to claim 25, wherein:

the holding chuck includes an exchange mechanism for forming a gap for inserting the unloading mounting arm, the gap being formed by floating the exposure member from an upper portion of the holding chuck by a predetermined interval at the time of unloading of the exposure member.

27. The improvement in a projection exposure device according to claim 3, wherein:

the exposure member holding mechanism includes a holding chuck rotating mechanism for rotating the holding chuck which attracts and holds the exposure member between an exposure position orthogonal to the horizontal optical axis and a mounting and demounting position in parallel with the horizontal optical axis;

and wherein the holding chuck rotating mechanism includes a rotating lever for rotatably holding the holding chuck by a first air cylinder; and a second air cylinder for rotating the holding chuck between the rotating lever and the first air cylinder.

28. The improvement in a projection exposure device according to claim 27, wherein the exposure device main body includes:

a loading mounting arm for mounting the exposure member to the holding chuck by attracting and holding when the holding chuck is at the mounting and demounting position by the holding chuck rotating mechanism; and an unloading mounting arm for discharging the exposure member held by the holding chuck by attracting the exposure member;

the loading mounting arm and the unloading mounting arm being disposed so that both the arms are allowed to advance and retreat respectively in different directions to each other.

29. The improvement in a projection exposure device according to claim 28, wherein:

the holding chuck includes an exchange mechanism for forming a gap for inserting the unloading mounting arm, the gap being formed by floating the exposure member from an upper portion of the holding chuck by a predetermined interval at the time of unloading of the exposure member.

30. The improvement in a projection exposure device according to claim 27, wherein:

the holding chuck includes an exchange mechanism for forming a gap for inserting the unloading mounting arm, the gap being formed by floating the exposure member from an upper portion of the holding chuck by a predetermined interval at the time of unloading of the exposure member.

31. The improvement in a projection exposure device according to claim 3 wherein an optical path length of the light emitted from the integrator to reach the converging means is set to be equal to an optical path length from the converging means to the entrance pupil of the projection lens.

32. The improvement in a projection exposure device according to claim 31, wherein the optical axis changing means comprises a total reflection mirror for totally reflecting the light exiting from the integrator; and the converging means comprises a concave mirror for collecting the reflected light from the total reflection mirror and for projecting the collected light into the entrance pupil of the projection lens.

33. The improvement in a projection exposure device according to claim 32, wherein the exposure device main body is independent of the optical source device and comprises a casing disposed within a chamber, the casing including the mask holding mechanism for holding the mask formed at a front end of the casing on the horizontal optical axis;

the exposure member holding mechanism for holding the exposure member formed at a rear end of the casing; and the projection lens holding mechanism for holding the projection lens disposed between the front end of the casing to the rear end of the casing.

34. The improvement in a projection exposure device according to claim 32, wherein the projection lens holding mechanism includes:

a base mounted within the casing;

a pair of leaf springs disposed on an upper surface of the base spaced from each other by a predetermined interval in the direction of the horizontal optical axis;

a movable plate fixed to upper ends of the leaf springs; and projection lens driving means for moving the movable plate in the direction of the horizontal optical axis;

the projection lens being mounted on the movable plate with an optical axis of the projection lens coincident with the horizontal optical axis.

35. The improvement in a projection exposure device according to claim 31, wherein the optical axis changing means comprises a dichroic mirror for reflecting the light exiting from the integrator; and the converging means comprises a Fresnel lens for collecting the light reflected from the dichroic mirror and for projecting the collected light into the entrance pupil of the projection lens.

36. The improvement in a projection exposure device according to claim 31, wherein the exposure device main body is independent of the optical source device and comprises a casing disposed within a chamber, the casing including the mask holding mechanism for holding the mask formed at a front end of the casing on the horizontal optical axis;

the exposure member holding mechanism for holding the exposure member formed at a rear end of the casing; and the projection lens holding mechanism for holding the projection lens disposed between the front end of the casing to the rear end of the casing.

37. The improvement in a projection exposure device according to claim 31, wherein the projection lens holding mechanism includes:

a base mounted within the casing;

a pair of leaf springs disposed on an upper surface of the base spaced from each other by a predetermined interval in the direction of the horizontal optical axis;

a movable plate fixed to upper ends of the leaf springs; and projection lens driving means for moving the movable plate in the direction of the horizontal optical axis;

the projection lens being mounted on the movable plate with an optical axis of the projection lens coincident with the horizontal optical axis.

38. The improvement in a projection exposure device according to claim 31, wherein:

the exposure member holding mechanism includes a horizontal moving mechanism and a vertical moving mechanism for guiding and driving a holding chuck having the exposure member mounted thereon in two-dimensional directions, both in a horizontal direction and in a vertical direction;

the vertical moving mechanism including tension means for cancelling a weight of the holding chuck.

39. The improvement in a projection exposure device according to claim 31, wherein the exposure member holding mechanism includes:

a holding chuck for attracting and holding the exposure member; and a clamp mechanism for sandwiching the exposure member held by the holding chuck; and wherein the clamp mechanism includes:

a clamp rotating mechanism provided on a side of the holding chuck; and a clamp member having a pin-piston;

the pin-piston being rotated by the clamp rotating mechanism between a clamp position at which the pin-piston opposes the exposure member from a vertical direction and a non-clamp position which is lower than a loading surface and an unloading surface of the exposure member;

the pin-piston being capable of opposing the exposure member from the vertical direction at the clamp position.

40. The improvement in a projection exposure device according to claim 31, wherein:

the exposure member holding mechanism includes a holding chuck rotating mechanism for rotating the holding chuck which attracts and holds the exposure member between an exposure position orthogonal to the horizontal optical axis and a mounting and demounting position in parallel with the horizontal optical axis;

and wherein the holding chuck rotating mechanism includes a rotating lever for rotatably holding the holding chuck by a first air cylinder; and a second air cylinder for rotating the holding chuck between the rotating lever and the first air cylinder.

41. In a projection exposure device in which an exposure light from a light source device is transmitted along a horizontal optical axis through a mask having a predetermined exposure pattern formed therein and an image of the exposure pattern is focused by a projection lens on an exposure member held by a holding mechanism, the exposure member being held by the holding mechanism so as to be movable at least in a plane orthogonal to the horizontal optical axis, the improvement comprising:

at least a pair of alignment marks formed at symmetrical positions with respect to the horizontal optical axis on opposite sides of an area of the mask having the exposure pattern formed in the area;

at least a pair of exposure member alignment marks formed on the exposure member, the pair of exposure member alignment marks respectively corresponding to the pair of mask alignment marks;

an illumination mechanism for illuminating the exposure member alignment marks by light with which a resist is not sensitive and for illuminating the mask alignment marks through the projection lens by superposing the reflected light from the exposure member alignment marks;

an alignment mark detection mechanism for detecting the relative positions of the mask alignment marks on which the reflected light is superposed by the illuminating mechanism and the exposure member alignment marks; and a mask holding mechanism, based on a relative position signal from the alignment mark detection mechanism, for moving the mask two-dimensionally with respect to the exposure member holding mechanism in a plane perpendicular to the horizontal optical axis.

42. The improvement in a projection exposure device according to claim 41, wherein the mask holding mechanism includes:

a holding frame for holding a mask stage movably in a two-dimensional plane with respect to a stationary portion;

the mask stage holding stage holding the mask; and a mask stage moving mechanism, interposed between the holding frame and the mask stage, for moving the mast stage two-dimensionally.

43. The improvement in a projection exposure device according to claim 41, wherein the mask stage moving mechanism comprises:

a vertical direction driving section including a wedge-like slidably moving body interposed between a lower surface of the mask stage and a slant surface slanted with respect to a horizontal plane, and a linear moving mechanism for moving the wedge-like sliding moving body along the slant surface; and a horizontal direction moving section including a wedge-like slidably moving body interposed between a side surface of the mask stage and a slant surface slanted with respect to a vertical surface, and a linear moving mechanism for moving the wedge-like slidably moving body along the slant surface.

* * * * *

UNITED STATES PATENT AND TRADEMARK OFFICE
CERTIFICATE OF CORRECTION

PATENT NO. : 5,204,711
DATED : April 20, 1993
INVENTOR(S) : Minoru Takubo et al

Page 1 of 2

It is certified that error appears in the above-indentified patent and that said Letters Patent is hereby corrected as shown below:

Column 4, line 32, please delete "18" and insert --19--.
Column 4, line 66, please delete "10a" and insert --20a--.
Column 5, line 5, please delete "11a" and insert --22a--.
Column 5, line 59, please delete "state" and insert --stage--.
Column 6, line 23, please delete "35" and insert --36c--.
Column 6, line 24, please delete "35b" and insert --35--.
Column 6, line 32, please delete "4" and insert --43--.
Column 6, line 55, please delete "the moving" and insert --horizontally moving--.
Column 6, line 56, please delete "52" and insert --"53c--.
Column 7, line 51, please delete "68a" and insert --68d--.
Column 8, line 63, please delete "21b" and insert --20b--.
Column 9, line 10, please delete "66" and insert --67--.
Column 10, line 12, please delete "36c" and insert --36a and 36b--.

UNITED STATES PATENT AND TRADEMARK OFFICE
CERTIFICATE OF CORRECTION

PATENT NO. : 5,204,711

DATED : April 20, 1993

INVENTOR(S) : Minoru Takubo et al

It is certified that error appears in the above-indentified patent and that said Letters Patent is hereby corrected as shown below:

```
Column 10, line 67, please delete "12" and insert --13--.
Column 11, line 43, please delete "14" and insert --15--.
Column 12, line 24, please delete "10b" and insert --103B--.
Column 12, line 30, please delete "105a-105b" and insert --106a-d--.
Column 12, line 33, please delete "108a" and insert 108A--.
Column 12, line 33, please delete "108b" and insert --108B--.
Column 12. line 36, please delete "10c" and insert --101c--.
Column 12, line 41, please delete "horizontally" and insert --vertically--.
Column 14, line 41, please delete "lever" and insert --levers--.
Column 14, line 62, please delete "lever" and insert --levers--.
Column 15, line 5, please delete "bracket" and insert --brackets--.
Column 16, line 29, please delete "205a-205d" and insert --205a,205b--.
Column 17, line 67, please delete "device may" and insert --device number 1 may--.
```

Signed and Sealed this

Thirty-first Day of January, 1995

BRUCE LEHMAN

*Attest:*

*Attesting Officer*  *Commissioner of Patents and Trademarks*